US012498126B2

(12) United States Patent
Stevenson et al.

(10) Patent No.: US 12,498,126 B2
(45) Date of Patent: Dec. 16, 2025

(54) ATTIC FAN ASSEMBLY WITH APERTURED, MONOLITHIC SIDEWALL ARRANGEMENT

(71) Applicant: QC Manufacturing, Inc., Temecula, CA (US)

(72) Inventors: Dustin Martin Stevenson, Menifee, CA (US); Dana Charles Stevenson, Canyon Lake, CA (US)

(73) Assignee: QC Manufacturing, Inc., Temecula, CA (US)

( * ) Notice: Subject to any disclaimer, the term of this patent is extended or adjusted under 35 U.S.C. 154(b) by 294 days.

(21) Appl. No.: 17/938,635

(22) Filed: Oct. 6, 2022

(65) Prior Publication Data

US 2023/0115888 A1 Apr. 13, 2023

Related U.S. Application Data

(60) Provisional application No. 63/253,497, filed on Oct. 7, 2021.

(51) Int. Cl.
*F24F 7/02* (2006.01)
*F04D 25/12* (2006.01)
*F04D 29/52* (2006.01)

(52) U.S. Cl.
CPC .......... *F24F 7/025* (2013.01); *F04D 29/522* (2013.01); *F04D 25/12* (2013.01)

(58) Field of Classification Search
CPC ......... F24F 7/025; F04D 25/12; F04D 29/522
See application file for complete search history.

(56) References Cited

U.S. PATENT DOCUMENTS

| | | | | |
|---|---|---|---|---|
| 2,684,621 A | * | 7/1954 | Cook | F24F 7/025 454/367 |
| 2,912,916 A | * | 11/1959 | Mohrman | F04D 29/701 415/121.2 |
| 3,401,624 A | * | 9/1968 | Mohrman | F24F 7/025 454/344 |
| 7,677,964 B1 | * | 3/2010 | Bucher | F24F 7/025 55/385.2 |
| 2020/0032519 A1 | * | 1/2020 | Bond | F24F 7/02 |

FOREIGN PATENT DOCUMENTS

| | | | | |
|---|---|---|---|---|
| CH | 531145 A | * | 11/1972 | |
| CN | 105351228 A | * | 2/2016 | ........... F04D 29/522 |
| CN | 113464477 A | * | 10/2021 | ............. F04D 25/14 |

OTHER PUBLICATIONS

English Machine Translation of CH-531145-A (Year: 1972).*

(Continued)

*Primary Examiner* — Nathan C Zollinger
(74) *Attorney, Agent, or Firm* — Knobbe, Martens, Olson & Bear, LLP

(57) ABSTRACT

An attic fan assembly having a cover, a housing, and a flashing. The housing having a first opening, a second opening, and a sidewall positioned between the openings. The sidewall having a plurality of apertures that can be positioned in a variety of configurations. A motor and fan blade assembly can be located within the housing. The flashing and the cover of the attic fan assembly can be removably attached to the housing. The flashing can be used to secure the attic fan assembly to the roof of a structure.

36 Claims, 18 Drawing Sheets

(56) References Cited

OTHER PUBLICATIONS

QuietCool AFG, GA, GX, and RM Models, Specialty Series Fans, Installation Guide, May 18, 2016.
QuietCool AFG SLR & AFR SLR Models, Solar Attic Fans, Owner's Guide, revised May 13, 2019.
QuietCool AFR SMT ES-2.0, Advanced Roof Mount Fans, Owner's Guide, Smart Attic Roof Mount Fan, revised Apr. 16, 2020.
QuietCool AFR SMT ES-2.0 Specifications, available on or before Sep. 30, 2020 (per Internet Archive Wayback Machine, https://quietcoolsystems.com/docs/QC AFR SMT ES-2.0-V1.pdf), accessed on Sep. 19, 2023.
QuietCool AFR SMT ES-2.0, Advanced Whole House Fans, website page, copyrighted 2021.
QuietCool AFR SLR-40W, Advanced Whole House Fans, Roof Mount 24/7 Solar Attic Fan with Inverter, website page, copyrighted 2021.
QuietCool Afr SLR-40W Specifications, available on or before Aug. 3, 2021.

* cited by examiner

ATTIC FAN ASSEMBLY WITH APERTURED, MONOLITHIC SIDEWALL ARRANGEMENT

INCORPORATION BY REFERENCE TO ANY PRIORITY APPLICATIONS

Any and all applications for which a foreign or domestic priority claim is identified in the Application Data Sheet as filed with the present application are incorporated by reference under 37 CFR 1.57 and made a part of this specification.

BACKGROUND

Field of the Disclosure

Certain embodiments discussed herein relate to attic fans.

Description of the Related Art

Attic fans are intended to cool hot attics by exhausting super-heated air from the attic and drawing cooler outside air into the attic. Overheated attics can cause premature failure of building materials (e.g., roofing, sheathing, joists, rafters, insulation, air conditioning ducts, etc.). Cooling the attic can reduce the cost of cooling the living space. Attic fans can also help to control the damage caused by moisture and humidity in the air.

SUMMARY

In some aspects, the techniques described herein relate to an attic fan assembly for a roof to cause airflow through an attic of a building structure, the attic fan assembly including one or more: a cylindrical housing including: a first circular opening; a second circular opening opposite the first circular opening; a sidewall extending between the first circular opening and the second circular opening; and a plurality of apertures in the sidewall, wherein two or more apertures are aligned along a central axis of the first circular opening or the second circular opening; a motor configured to rotate a fan drive shaft, the motor disposed inside the cylindrical housing; a fan blade assembly within the cylindrical housing and secured to the fan drive shaft, wherein motor and fan blade assembly are configured to draw air into the cylindrical housing through the first circular opening and to exhaust air out of the cylindrical housing through the second circular opening to cause airflow through an attic of a building structure; a flashing connected to the cylindrical housing at the first circular opening and circumscribing the first circular opening, the flashing configured to connect to a roof of the building structure to secure the attic fan assembly to the roof; and/or a cover connected to the cylindrical housing at the second circular opening, the cover positioned over the second circular opening to inhibit environmental debris from entering the cylindrical housing.

In some aspects, the techniques described herein relate to an attic fan assembly, wherein the two or more apertures are positioned in a honeycomb pattern.

In some aspects, the techniques described herein relate to an attic fan assembly, wherein the two or more apertures are offset relative to each other along the central axis.

In some aspects, the techniques described herein relate to an attic fan assembly, wherein the two or more apertures are aligned along the central axis.

In some aspects, the techniques described herein relate to an attic fan assembly, wherein the two or more apertures are aligned along a line extending at an angle offset from the central axis.

In some aspects, the techniques described herein relate to an attic fan assembly, wherein the two or more apertures are circular.

In some aspects, the techniques described herein relate to an attic fan assembly, wherein the two or more apertures are on the sidewall less than half of the extent of the sidewall.

In some aspects, the techniques described herein relate to an attic fan assembly, further including four or more apertures along a circumference of the cylindrical housing.

In some aspects, the techniques described herein relate to an attic fan assembly, wherein the four or more apertures along the circumference of the housing are positioned in a honeycomb pattern.

In some aspects, the techniques described herein relate to an attic fan assembly, wherein the four or more apertures along the circumference of the housing are aligned along the circumference of the housing.

In some aspects, the techniques described herein relate to an attic fan assembly, wherein the four or more apertures along the circumference of the housing are circular.

In some aspects, the techniques described herein relate to an attic fan assembly, further including a protrusion extending around the cylindrical housing about the central axis, the protrusion configured to inhibit environmental debris from entering the cylindrical housing.

In some aspects, the techniques described herein relate to an attic fan assembly, wherein the protrusion is a bead of the sidewall of the cylindrical housing, the bead formed from the material of the sidewall.

In some aspects, the techniques described herein relate to an attic fan assembly, wherein the protrusion includes a rod or a flange positioned about the cylindrical housing.

In some aspects, the techniques described herein relate to an attic fan assembly, wherein the sidewall includes tabs extending radially outward from the cylindrical housing at the second circular opening, the cover connected to the cylindrical housing via the tabs.

In some aspects, the techniques described herein relate to an attic fan assembly, wherein the tabs and the sidewall are monolithic.

In some aspects, the techniques described herein relate to an attic fan assembly, wherein the flashing is connected to the cylindrical housing via one or more fasteners.

In some aspects, the techniques described herein relate to an attic fan assembly, wherein the flashing is configured to be disconnected from the cylindrical housing, and wherein the cylindrical housing is configured to connect to an other flashing at the first circular opening.

In some aspects, the techniques described herein relate to an attic fan assembly, wherein the sidewall supports the cover without other support brackets.

In some aspects, the techniques described herein relate to an attic fan assembly, wherein the sidewall is monolithic.

In some aspects, the techniques described herein relate to an attic fan assembly, wherein the apertures are stamped into the cylindrical housing.

In some aspects, the techniques described herein relate to an attic fan assembly, wherein the apertures are positioned in a symmetrical pattern.

In some aspects, the techniques described herein relate to an attic fan assembly, further including a solar panel connected to the cover.

In some aspects, the techniques described herein relate to an attic fan assembly, wherein the motor is connected to the sidewall of the cylindrical housing.

In some aspects, the techniques described herein relate to an attic fan housing including one or more: a first opening; a second opening; a sidewall extending between the first opening and the second opening; and/or a plurality of apertures in the sidewall, wherein the plurality of apertures positioned in a symmetrical pattern along an extent of the sidewall, the extent between the first and second openings.

In some aspects, the techniques described herein relate to an attic fan housing, wherein the sidewall has a cylindrical shape.

In some aspects, the techniques described herein relate to an attic fan housing, further including a bead extending around the housing, the bead configured to inhibit environmental debris from entering the housing.

In some aspects, the techniques described herein relate to an attic fan housing, wherein the bead is a protrusion of the sidewall of the housing.

In some aspects, the techniques described herein relate to an attic fan housing, wherein the sidewall is monolithic.

In some aspects, the techniques described herein relate to an attic fan housing, wherein the plurality of apertures are positioned in a honeycomb pattern.

In some aspects, the techniques described herein relate to an attic fan housing, wherein the apertures are displaced relative to each other along the extent of the sidewall.

In some aspects, the techniques described herein relate to an attic fan housing, wherein the apertures are aligned relative to each other along the extent of the sidewall.

In some aspects, the techniques described herein relate to an attic fan housing, wherein the apertures are circular.

In some aspects, the techniques described herein relate to an attic fan housing, wherein the sidewall comprises a plurality of sections moveable relative to each other about a central axis of the housing, at least two of the plurality of sections comprising a long extent portion along the central relative to a short extent portion along the central axis to allow for adjustment of an angle between the first opening and the second opening based on relative positions of the long extent portions and the short extent portions of the at least two of the plurality of sections about the central axis.

In some aspects, the techniques described herein relate to an attic fan assembly including one or more: the attic fan housing of any one or more of the preceding paragraphs; a fan blade assembly within the attic fan housing; a motor configured to rotate a fan drive shaft, the motor disposed inside the attic fan housing; a cover connected the attic fan housing at the second opening and positioned over the opening to inhibit environmental debris from entering the attic fan housing; and/or a flashing connected to the attic fan housing at the first opening and configured to connect to a roof of a building structure to secure the attic fan assembly to the roof.

In some aspects, the techniques described herein relate to an attic fan assembly, further including at least one solar panel coupled to the cover.

In some aspects, the techniques described herein relate to an attic fan assembly, wherein the flashing is configured to be disconnected from the attic fan housing, and wherein the attic fan housing is configured to connect to an other flashing at the first opening.

In some aspects, the techniques described herein relate to an attic fan assembly, wherein the motor is connected to the attic fan housing.

In some aspects, the techniques described herein relate to a method of manufacturing an attic fan assembly for installation on a roof, the method including one or more: stamping a plurality of apertures into a sheet of material; wrapping two ends of the sheet of material to form a cylindrical housing with a first circular opening and a second circular opening opposite the first circular opening; fixedly connecting the two ends of the sheet of material; positioning a motor within the cylindrical housing, the motor configured to rotate a fan drive shaft; connecting a fan blade assembly, wherein motor and fan blade assembly are configured to draw air into the cylindrical housing through the first circular opening and to exhaust air out of the cylindrical housing through the second circular opening to cause airflow through an attic of a building structure; connecting a flashing to the cylindrical housing at the first circular opening to circumscribe the first circular opening, the flashing configured to connect to a roof of the building structure to secure the attic fan assembly to the roof; and/or connecting a cover to the cylindrical housing at the second circular opening, the cover extending over the second circular opening to inhibit environmental debris from entering the cylindrical housing.

In some aspects, the techniques described herein relate to a method, wherein the plurality of apertures are stamped along an extent of the sheet of material, the extent along a central axis of the first circular opening or the second circular opening.

In some aspects, the techniques described herein relate to a method, wherein the plurality of apertures are stamped to be displaced relative to each other along the extent of the sheet of material.

In some aspects, the techniques described herein relate to a method, wherein the plurality of apertures are stamped to be aligned relative to each other along the extent of the sheet of material.

In some aspects, the techniques described herein relate to a method, wherein the plurality of apertures are stamped to align along a line extending at an angle offset from a central axis of the first circular opening or the second circular opening.

In some aspects, the techniques described herein relate to a method, wherein the plurality of apertures are stamped in a honeycomb pattern.

In some aspects, the techniques described herein relate to a method, wherein the plurality of apertures are circular.

In some aspects, the techniques described herein relate to a method, wherein the plurality of apertures are stamped into the sheet of material less than half of an extent of the sheet of material, the extent between the first circular opening and the second circular opening.

In some aspects, the techniques described herein relate to a method, wherein four or more apertures of the plurality of apertures are stamped along a circumference of the cylindrical housing.

In some aspects, the techniques described herein relate to a method, wherein the four or more apertures along the circumference are stamped in a honeycomb pattern.

In some aspects, the techniques described herein relate to a method, wherein the four or more apertures along the circumference are stamped to be displaced relative to each other.

In some aspects, the techniques described herein relate to a method, wherein the four or more apertures along the circumference are circular.

In some aspects, the techniques described herein relate to a method, further including extending a bead extending around the cylindrical housing, the bead configured to inhibit environmental debris from entering the cylindrical housing.

In some aspects, the techniques described herein relate to a method, wherein extending the bead includes forming a protrusion in the sheet of material extending between the two ends of the sheet of material.

In some aspects, the techniques described herein relate to a method, wherein the bead is stamped or rolled into the sheet of material.

In some aspects, the techniques described herein relate to a method, wherein extending the bead includes wrapping a rod or a flange about the cylindrical housing.

In some aspects, the techniques described herein relate to a method, further including stamping tabs from the sheet of the material to extend radially outward from the cylindrical housing at the second circular opening, and wherein connecting the cover to the cylindrical housing includes connecting the cover to the tabs via fasteners.

In some aspects, the techniques described herein relate to a method, wherein connecting the flashing to the cylindrical housing includes mating a flange of the flashing to the cylindrical housing.

In some aspects, the techniques described herein relate to a method, further including extending one or more fasteners through the flange and the cylindrical housing to connect the flashing to the cylindrical housing.

In some aspects, the techniques described herein relate to a method, wherein the apertures are stamped in a symmetrical pattern.

In some aspects, the techniques described herein relate to a method, further including connecting a solar panel to the cover.

In some aspects, the techniques described herein relate to a method, further including connecting the motor to the cylindrical housing.

Methods of using the system(s) (including device(s), apparatus(es), assembly(ies), structure(s), and/or the like) disclosed herein are included; the methods of use can include using or assembling any one or more of the features disclosed herein to achieve functions and/or features of the system(s) as discussed in this disclosure. Methods of manufacturing the system(s) disclosed herein are included; the methods of manufacture can include providing, making, connecting, assembling, and/or installing any one or more of the features of the system(s) disclosed herein to achieve functions and/or features of the system(s) as discussed in this disclosure.

This Summary is provided to introduce a selection of concepts in a simplified form that are further described below in the Detailed Description. This Summary is not intended to identify key features or essential features of any subject matter described herein.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through the use of the accompanying drawings.

DETAILED DESCRIPTION

Embodiments of systems, components and methods of assembly and manufacture will now be described with reference to the accompanying figures, wherein like numerals refer to like or similar elements throughout. Although several embodiments, examples and illustrations are disclosed below, it will be understood by those of ordinary skill in the art that the inventions described herein extend beyond the specifically disclosed embodiments, examples, and illustrations, and can include other uses of the inventions and obvious modifications and equivalents thereof. In addition, embodiments of the inventions can comprise several novel features and no single feature is solely responsible for its desirable attributes or is essential to practicing the inventions herein described.

Figure 1:
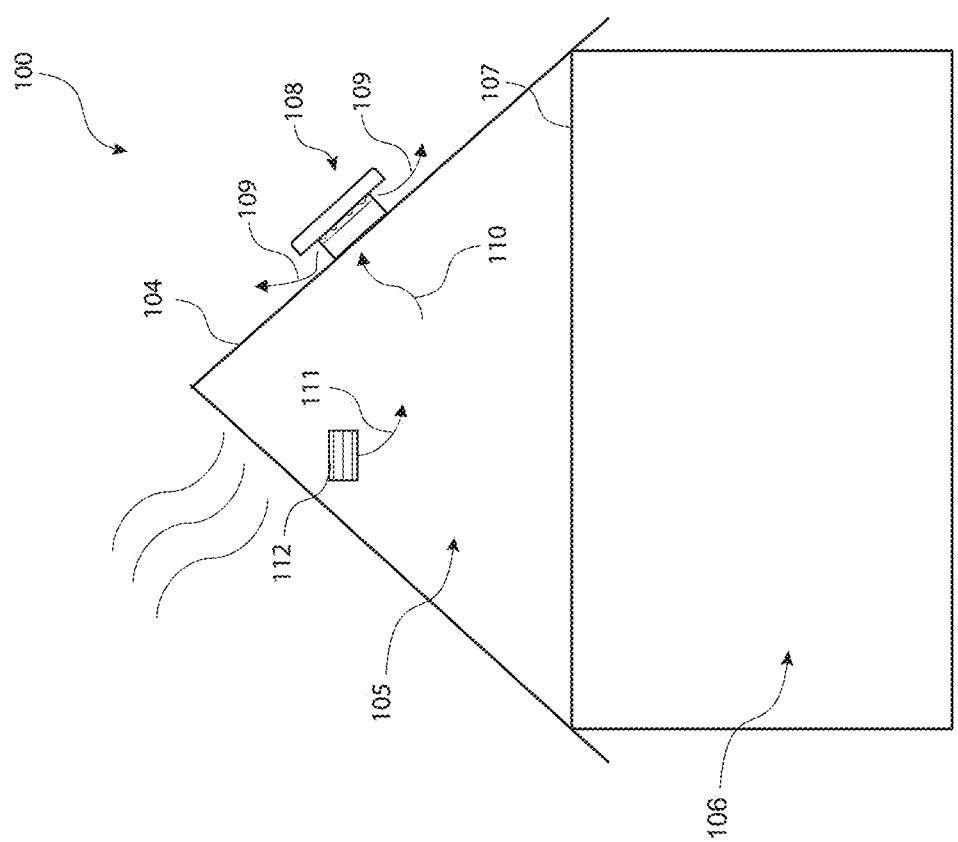
FIG. 1 is a section view of a structure showing an attic fan assembly secured to a roof.

FIG. 1 depicts a schematic of a structure or building 100 having a roof 104 and an inside of an attic 105 of the structure 100. An attic fan assembly 108 is connected to the roof 104. The attic fan assembly 108 can be installed in a vented attic. The attic fan assembly 108 can be installed in a sealed or conditioned attic. Air entering the inside of the attic 105 (i.e., inside the structure, building, house, etc.) can travel into the attic 105 through a vent or vents 112. The air entering the attic 105 can come from outside the structure 100. The air can come from outside the structure and through the vents 112 as shown by arrow 111. The air within the attic 105, which may be hotter relative to the ambient air around the building structure, can then exit the attic through the attic fan assembly 108, as shown by the arrows 109, 110.

The attic fan assembly 108 can prevent or reduce attic overheating to avoid premature failure of building materials (e.g., roofing, sheathing, joists, rafters, insulation, air conditioning ducts, etc.) as well as reduce electricity consumption via the HVAC system running less as discussed herein. With continued reference to FIG. 1, solar heating (denoted as a set of parallel wavy arrows in FIG. 1) can increase the temperature of a roof 104 of a building structure 100. In some cases, solar heating can raise the temperature of the roof 104 to over 150° F. Heat from the roof 104 can be transferred by conduction to the air in the inside of the attic 105 that is adjacent to the roof 104. In addition, warmer air within the attic 105 can rise and accumulate near the roof 104. Heat from the attic 105 can find its way to the living space 106 of the structure 100 by conduction through the insulation at the attic floor 107 or through the A/C duct work, causing the temperature of the living space 106 to increase. Heat entering the living space 106 from the attic 105 can cause an air-conditioning system to run longer and work harder to cool the living space 106.

The attic fan assembly 108 can reduce the attic air near the roof 104 warming the attic 105 air near the floor 107. By removing the super-heated air near the roof 104 before it warms the attic 105 air near the floor 107, the attic fan assembly 108 can minimize heat conduction through the floor 107 and into the living space 106 and reduce the need to use an HVAC system to keep to living space 106 cool. Super-heated air in the attic 105 can also increase the temperature of the attic building structures (e.g., joists, studs), creating an overheated attic 105. The building structures of an overheated attic can act as a thermal reservoir, heating cool outside air that is pulled in through the vents 112 and compromising the cooling effect of the attic fan 108. The attic fan assembly 108 can avoid or reduce overheating of the attic 105. The attic fan assembly 108 can also reduce humidity of the attic 105 by bringing cooler, less humid, ambient air.

Figure 2:
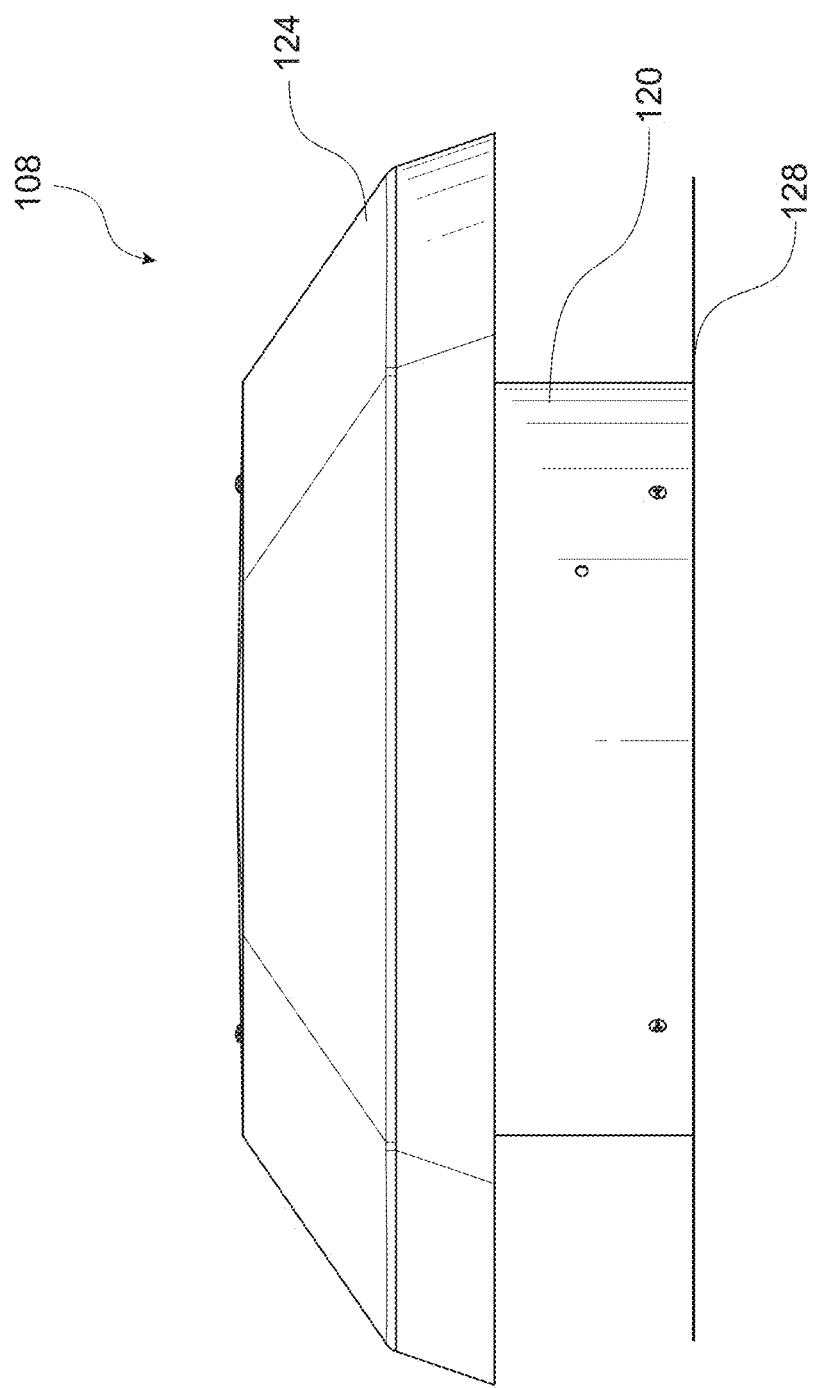
FIG. 2 is a side view of an attic fan assembly.

FIG. 2 is a side view of an attic fan assembly 108. The attic fan assembly 108 can have a housing 120, a cover 124 and a flashing 128. The cover 124 and the flashing 128 can be connected to the housing 120, as described in more detail below. The cover 124 and the flashing 128 can be removable from the attic fan assembly 108. The housing 120 can be coupled to any cover 124 and any flashing 128.

Figure 3:
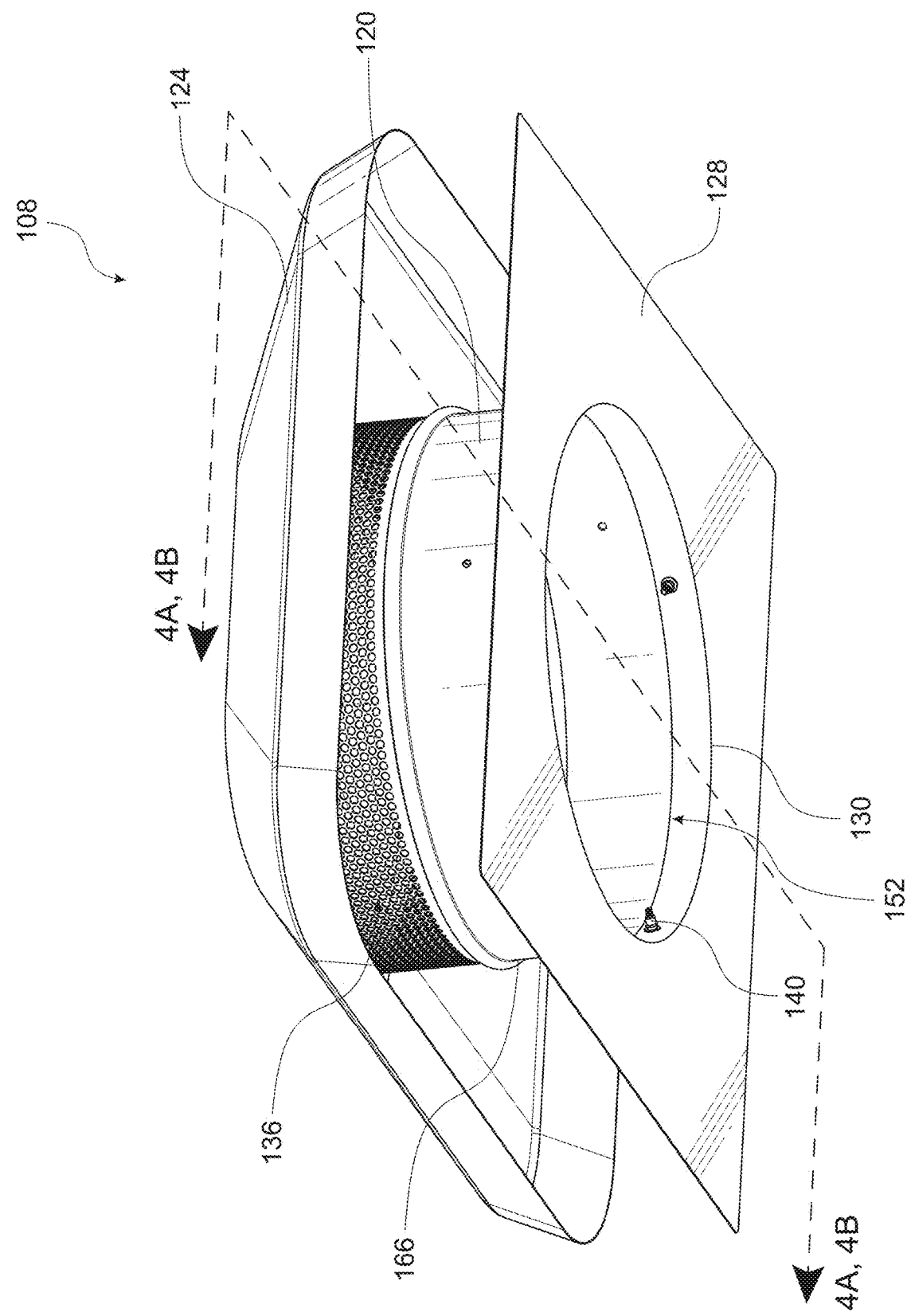
FIG. 3 is a perspective view of the attic fan assembly of FIG. 2.

FIG. 3 is a perspective view of an attic fan assembly 108. As described above, the attic fan assembly 108 can have a housing 120, a cover 124, and a flashing 128. The housing can have a protrusion 166 and apertures 136, discussed in more detail below. The flashing 128 can be connected to the housing 120 via fasteners 140. Any number of fasteners 140 may be used, for example, one, two, three, four, or more. The flashing 128 can be removably connected. In some embodiments, the flashing 128 can be connected to the housing 120 using screws, rivets, snap fit members, and/or male and female mating parts. The removability of the flashing 128 can offer benefits, for example, the flashing 128 can be customized to accommodate any roof variation. Roofs can have different contours and the flashing 128 can be curved to accommodate the contours of a specific roof. The flashing 128 can have a variety of outer shapes to accommodate different roofs, for example, the overall shape may be square, rectangular, circular, etc.

The flashing 128 can have an opening 130. The opening 130 of the flashing 128 can correspond to the first opening 152 of the housing 120, as described in more detail below. The airflow can travel from inside the structure (e.g., structure 100) through the opening 130 of the flashing 128 and the first opening 152 of the housing 120. The airflow can then travel out of the apertures 136. The flashing 128 can be used to connect or secure the attic fan assembly 108 to the roof of a structure, as shown in FIG. 1.

Figure 4A:
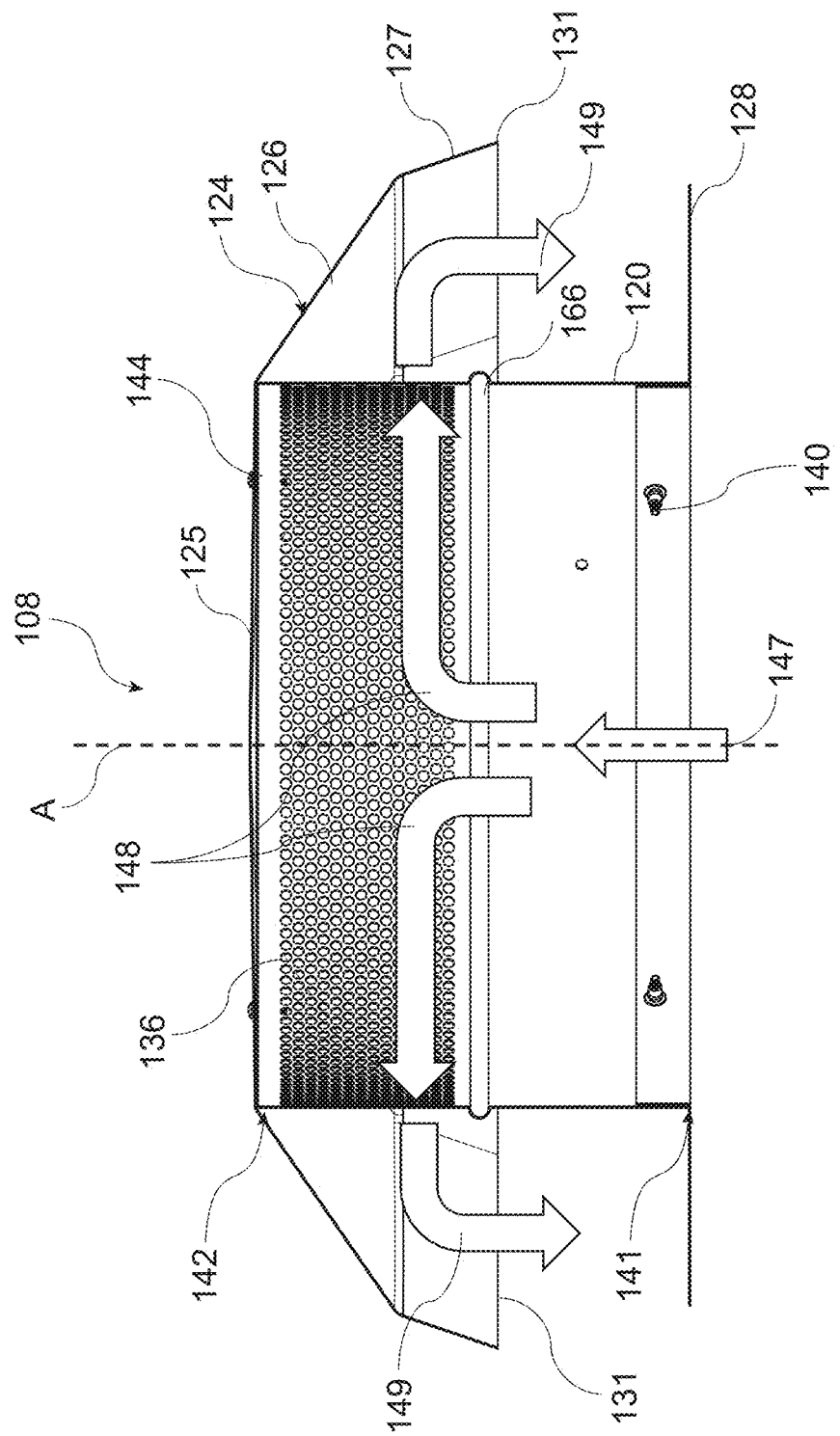
FIG. 4A is a cross-section of the attic fan assembly as shown in FIG. 3.

As shown in FIG. 4A, and described throughout, the air can enter the housing 120 from the attic 105 at arrow 147. The air can the exit the housing 120 at arrows 148 through apertures 136 as discussed herein. The air can then move away from the cover 124 of the housing 120 at arrows 149.

Figure 4B:
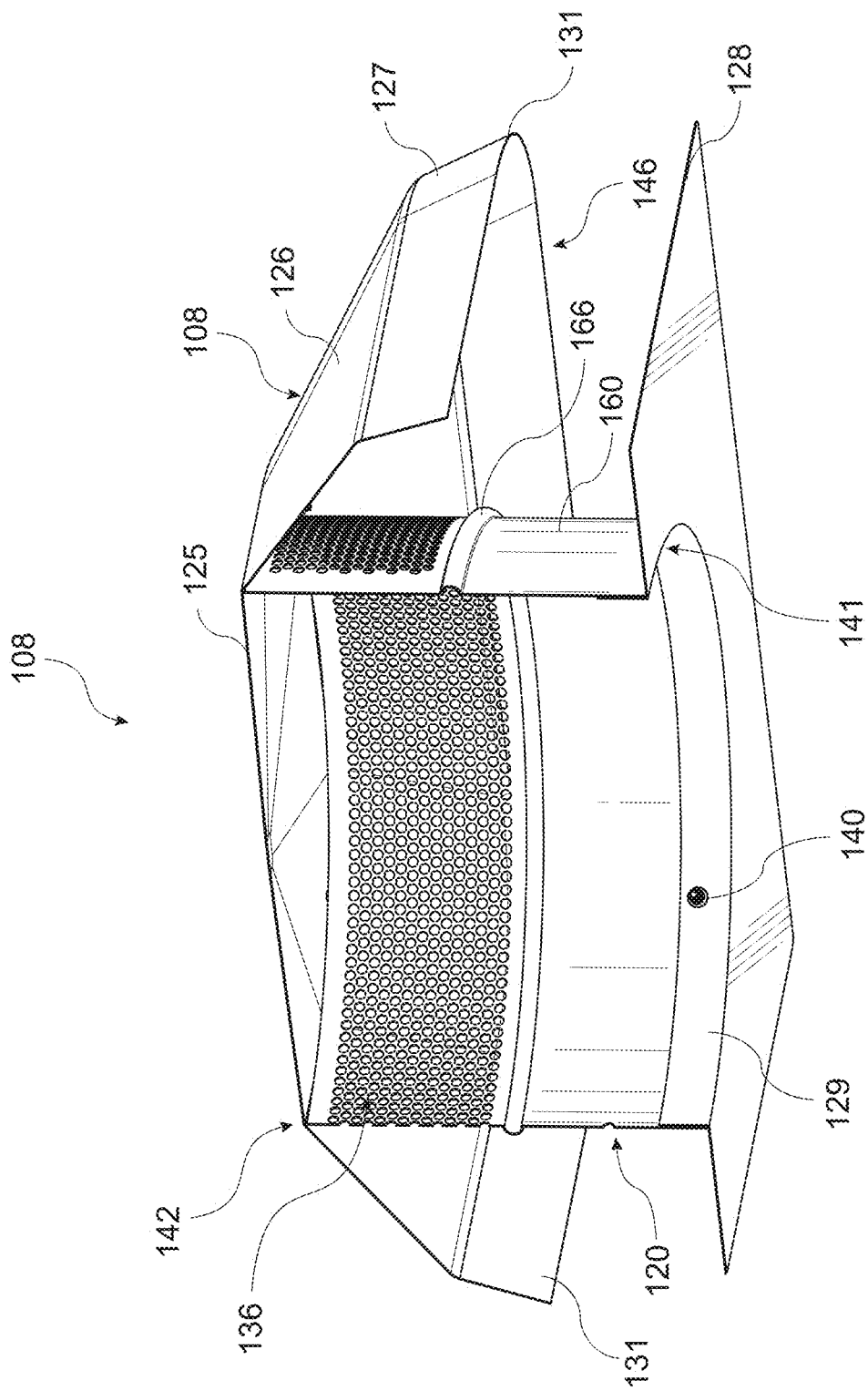
FIG. 4B is a perspective view of a cross-section of the attic fan assembly as shown in FIG. 3.

FIG. 4A-4B show cross sections of an attic fan assembly 108. As described above, the attic fan assembly 108 can include a housing 120, a cover 124, and a flashing 128. The housing 120 can have apertures, opening, or holes 136, discussed in more detail below. As shown in FIG. 4A, the flashing 128 can be connected to the housing 120 at a first end 141 via fasteners 140 or by any suitable means as described above. The flashing 128 can have a flange 129 that extends generally perpendicular to a surface of the flashing 128 (e.g., surface of the flashing configured to be against the roof 104, including planar surface or other contoured surfaces; the flange 129 can be perpendicular to the surface of the flashing at the point of connection of the flashing and the surface to be positioned against the roof 104). In some embodiments, the flange 129 can extend up and into the housing 120. In some embodiments, the flange 129 can extend around the outside of the housing 120. The fasteners 140 can connect the housing 120 to the flange 129 of the flashing 128. The flashing 128 size and shape can vary based on the attic fan assembly 108. In some embodiments, the flashing 128 can be about 15 inches by 15 inches to about 50 inches by 50 inches or any value in-between. In some embodiments, the flashing can be made of metal, for example, steel or aluminum. In some embodiments, the flashing can be made of resin, composite, plastic, or other polymer materials.

The cover 124 can be connected to the housing 120 at a rim at a second end 142 via fasteners 144. The rim can be a monolithic material of the sidewall that extends fully around the second circular opening about the central axis. Any number of fasteners can be used to connect the flashing 128 and the cover 124. In some embodiments, the cover 124 can be connected to the housing 120 using screws, rivets, snap fit members, and/or male and female mating parts. The cover 124 can extend outwardly past the sidewall 160 of the housing 120 forming an open space 146. The open space 146 can allow airflow to travel through the apertures 136 and out of the structure (e.g., structure 100). The cover 124 can be any shape.

The cover 124 can extend from the second end 142 outward from and along the central axis A to form the open space 146. In some cases, the cover 124 can extend past the portion of the sidewall 160 having the apertures 136 as discussed herein. For example, as illustrated in FIG. 4A, a periphery or edge 131 of the cover 124 can extend from the second end 142 toward the first end 141 about the sidewall 160 along the central axis A such that the edge 131 is past or extends beyond the portion of the sidewall 160 with the apertures 136. Accordingly, the cover 124 is positioned over and covers the apertures 136 along the central axis A. In some cases, as illustrated in FIG. 4A, the cover 124 extends along the central axis A such that the edge 131 extends and is positioned past the protrusion 166 from the second end 142 toward the first end 141. The edge 131 of the cover 124 can be proximate to the first end 141 relative to the apertures 136, protrusion 166 and/or second end 142.

The cover 124 can have a top portion 125 and a side portion 126. In some embodiments, the cover 124 can have a downwardly extending portion 127. The side portion 126 can extend down and out from the top portion 125. The downwardly extending portion 127 can extend farther down from the side portion 126. In some embodiments, the top portion 125 can extend past the sidewall 160 of the housing 120. In some embodiments, the side portion 126 can be the only portion that extends past the sidewall 160 of the housing 120. The cover 124 can provide the benefit of keeping environmental debris, such as rain, leaves, dirt, etc., from entering the structure 100 through the attic fan assembly 108. The cover 124 can be made of metal, for example, steel or aluminum. In some embodiments, the cover 124 can be made of resin, composite, plastic, or other polymer materials. The cover 124 can have dimensions of 15 inches by 15 inches to 50 inches by 50 inches or any value in-between. The size of the cover 124 can vary based on overall size of the attic fan assembly 108. The cover 124 can have a thickness of 0.010 to 0.5 inches, including 0.10 inches, 0.2 inches, 0.3 inches, 0.5 inches, including any value in-between. In some case, the cover 124 can have a thickness of 32 gage, 12 gage, or 10 gage. The cover 124 can be relatively thicker material when the cover 124 is made from polymers versus metal.

Figure 5:
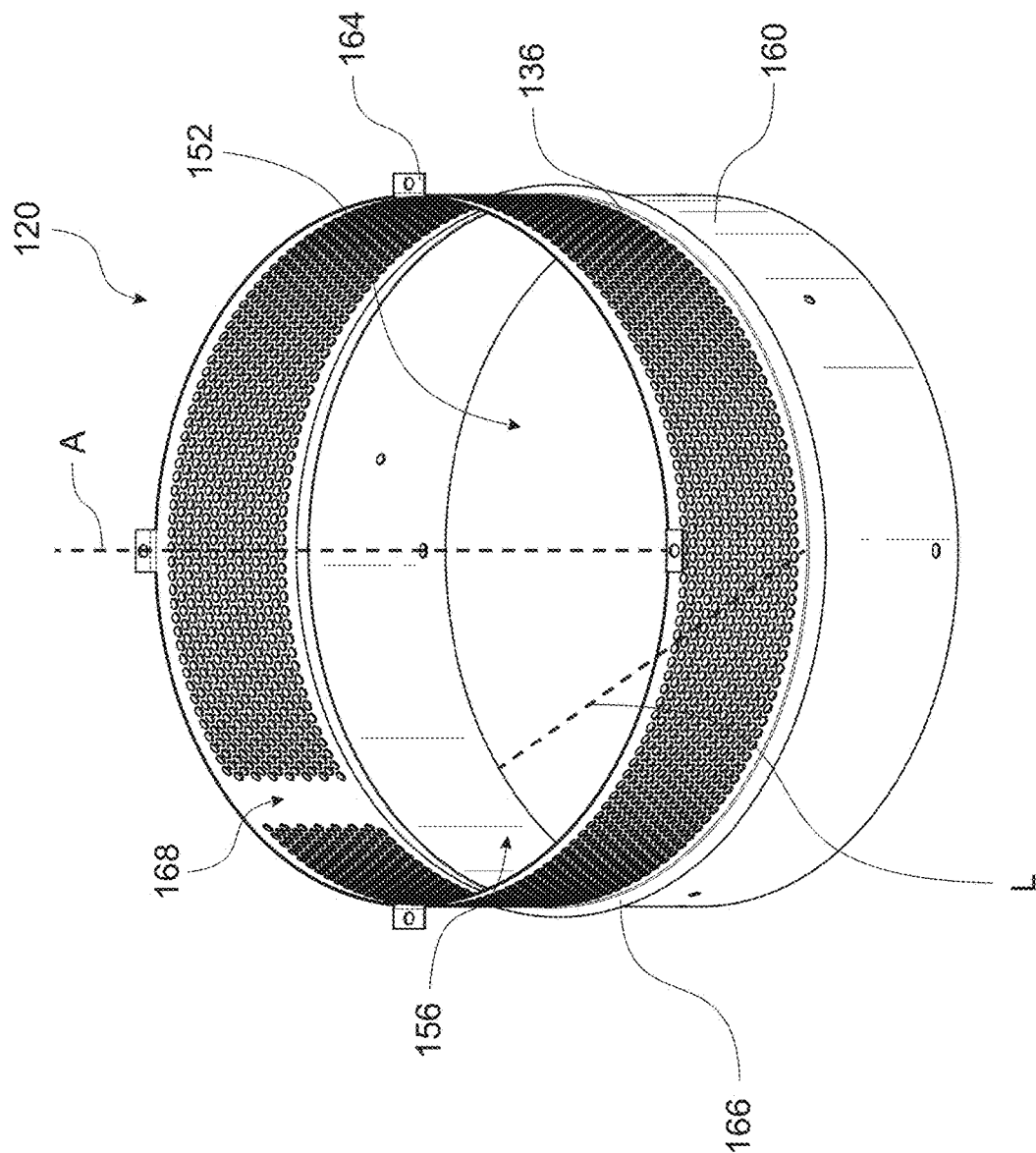
FIG. 5 shows a housing of an attic fan assembly.

FIG. 5 shows a housing 120 of an attic fan assembly 108. The housing can have a first opening or end 152 and a second opening or end 156. A sidewall 160 can extend between the first opening 152 and second opening 156. The sidewall 160 can support the cover 124 without the use of other support brackets. The sidewall 160 can be monolithic. In some embodiments, the housing 120 can be cylindrical and each opening 152, 156 can be circular. The attic fan assembly 108, including the sidewall 160, the flashing 128, and the cover 124, can be made of metal, for example, steel or aluminum. In some embodiments, the flashing 128 can be made of resin, composite, plastic, or other polymer materials. The housing 120 or sidewall 160 can have a diameter of about 10 inches, 20 inches, 25 inches, 30 inches, 40 inches, 48 inches, or more, or any value in-between. The housing 120 or sidewall 160 can have a thickness of 0.010 to 0.5 inches, including 0.10 inches, 0.2 inches, 0.3 inches, 0.5 inches, including any value in-between. In some case, the housing 120 or sidewall 160 can have a thickness of 32 gage, 12 gage, or 10 gage. The sidewall 160 can be relatively thicker material when the sidewall 160 is made from polymers versus metal.

The housing 120 can include tabs 164. In some embodiments, the tabs 164 and the sidewall 160 can be monolithic. In some embodiments, the tabs can be separate and can be welded, screwed, otherwise attached to the sidewall 160. The tabs 164 can be formed from the same material forming the sidewall 160 such that a continuous piece of material extends from the sidewall to the tabs 164 to form the tabs 164. The tabs 164 can be formed via a stamping process. The stamping process to create the tabs 164 can increase manufacturing efficiency and lower manufacturing costs. For example, tabs 164 can be stamped from a monolithic, single sheet of material that forms the housing 120 as discussed herein. In some embodiments, the tabs 164 can be cut (e.g., laser cut) from a monolithic, single sheet of material that forms the housing 120 as discussed herein. After being stamped or otherwise formed, the tabs 164 can be shaped and bent to be generally perpendicular to the sidewall 160 of the housing 120. For example, the tabs 164 may radially extend outward away from the central axis A, away or out of the second opening 156. In some embodiments, the tabs 164 may radially extend inward toward the central axis A, into the second opening 156.

The cover 124 (e.g., as shown in FIGS. 2-4B) can be connected to the housing 120 via the tabs 164 using fasteners. The tabs 164 can extend substantially flat against the cover 124 such that the surfaces of the tabs 164 facing the corresponding surface of the cover 124 are in contact with each other when the cover 124 is connected to the housing 120 via the tabs 164. The housing 120 can have one, two, three, four or more tabs 164. In some embodiments, the cover 124 can be connected to the housing 120 using screws, rivets, snap fit members, and/or male and female mating parts.

The housing 120 can include a protrusion 166. The protrusion 166 can extend the entire circumference of the housing 120. The bead can prevent or inhibit debris from entering the housing 120 as discussed below. The protrusion 166 can be positioned along the central axis A at about ⅓ to ⅔, including ½, and including any value in-between, of the overall or whole length of the sidewall 160 along central axis A (e.g., length or extent between the first end 141 and the second send 142). For example, the length or extent of the sidewall 160 along the central axis A can be 10 inches between the first end 141 and the second send 142; the protrusion 166 can be positioned at about 5 inches from the first end 141 or the second end 142.

In some embodiments, the protrusion 166 can be a bead or lip stamped into the sidewall 160 of the housing 120. In some embodiments, the protrusion 166 can be a rod or flange positioned or rolled about the housing 120. The rod or flange can be a separate piece of material from the housing 120. The rod or flange can be formed separate from the sidewall 160 and then connected to the sidewall 160 via friction fit, welding, soldering, fasteners, etc. For example, the rod or flange can be wrapped around or rolled onto the housing to have the rod's or flange's inner diameter about the central axis A correspond to the housing's 124 outer diameter about the central axis A. The protrusion 166 (e.g., the bead rod, and/or flange) can be used to inhibit environmental debris, such as leaves, rain, dirt, etc. from entering the structure 100. For example, as debris travel up the sidewall 160, the protrusion 166 can stop the debris from reaching the apertures 136 and therefore help prevent the debris from entering the structure 100. The protrusion 166 can act as a second safeguard, in connection with the cover 124, to prevent outside debris from entering the structure 100.

In some embodiments, the sidewall 160 of the housing 120 can connect to itself at and be formed via a connecting area or portion 168. The housing 120 can start as a flat sheet material and be shaped into a circular shape such as a cylinder as illustrated. Ends of the sheet of material 160 can be connected at the connecting area 168. In some embodiments, the sidewall 160 can be welded, soldered, or bonded together at both ends to form the connecting area 168 of the ends of the material. In some embodiments, the connecting area 168 can have no apertures 136. The connecting area 168 can provide additional support to the attic fan assembly 108.

The connecting area 168 can be a portion of the housing that is a solid piece of material extending along the central axis A between the first and second ends 141, 142. The connecting area 168 extending the length of the sidewall 160 from the first opening 152 to the second opening 156 can provide the additional structural support because there are no breaks or apertures 136 in the connecting area 168 impacting the integrity of the housing 120. In some embodiments, the connecting area 168 can be stronger than the remaining portion of the housing 120. In some embodiments, connecting area 168 can have apertures 136 in any pattern as discussed herein.

Figure 6A:
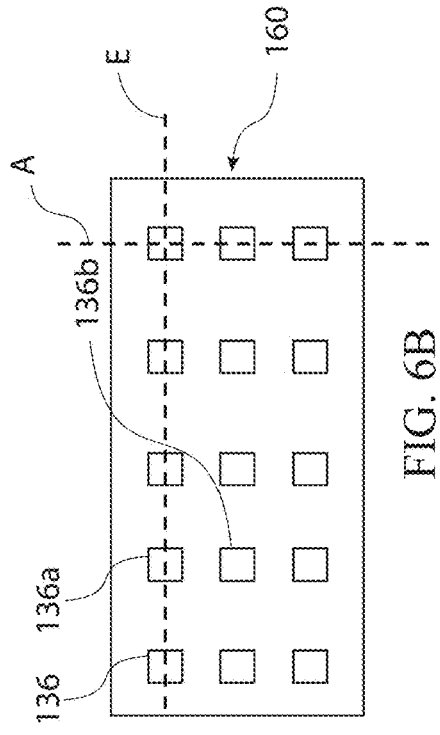
FIGS. 6A-6D show arrangements of apertures in a sidewall.
Figure 6B:
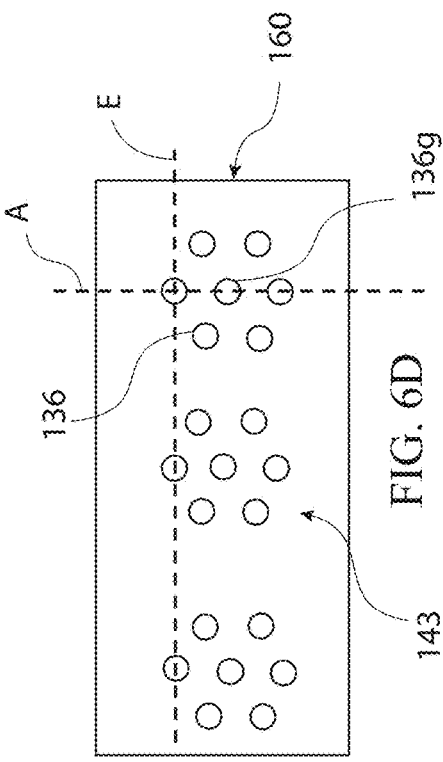
Figure 6C:
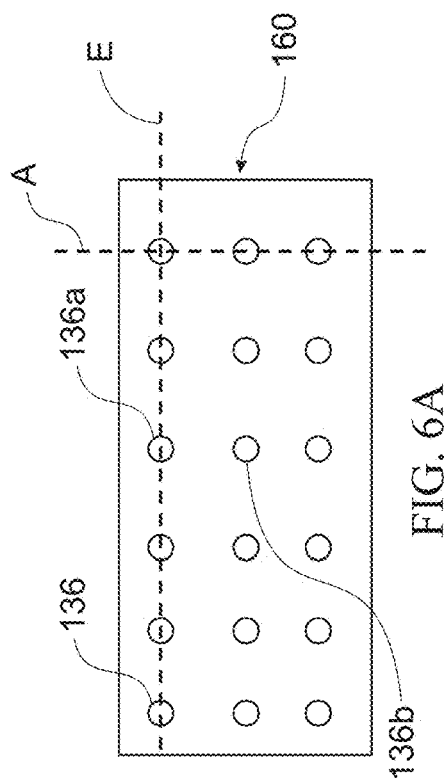

The housing 120 can include apertures 136. The apertures 136 can be positioned around the circumference of the sidewall 160. The apertures 136 can be any suitable shape, for example circular (e.g., as shown in FIGS. 6A and 6E), rectangular (e.g., as shown in FIG. 6B), polygonal such as hexagonal or octagonal (e.g., as shown in FIG. 6C), etc. Any shape can be used with any pattern or configuration described. In some embodiments, the apertures 136 can be positioned in a honeycomb pattern, as shown for example in FIGS. 6C and 6D and discussed herein.

In some embodiments, the apertures are configured and arranged on the sidewall in a manner such that the total area of the apertures 136 (e.g., removed surface area of the outer surface of the sidewall 160) is 15 to 40% of the total area of the sidewall 160 (e.g., outer surface area of the sidewall 160), including 20 to 35%, including 20 to 30%, including 25%, including any value in-between. Accordingly, the ratio between the total area of the apertures 136 (e.g., removed surface area of the outer surface of the sidewall 160) and the total area of the sidewall 160 (e.g., outer surface area of the sidewall 160) can be 0.15 to 0.4, including 0.2 to 0.35, including 0.2 to 0.3, including 0.25, including any value in-between. In some embodiments, the length or extent of the sidewall 160 along the central axis A can be 5 to 20 inches, including 8 to 12 inches, including 10 inches, and including any value in-between. The length or extent of the sidewall 160 along which the apertures 136 are positioned along the central axis A can be about 1/3 to 2/3, including 9/20, including 1/2, and including any value in-between, of the overall or whole length of the sidewall 160 along central axis A (e.g., length or extent between the first end 141 and the second send 142). For example, the length or extent of the sidewall 160 along the central axis A can be 10 inches between the first end 141 and the second end 142; the length or extent of the sidewall 160 along the central axis A having apertures 136 can be 4.5 inches or 5 inches.

In some embodiments, the apertures 136 are configured and arranged on the sidewall in a manner such that the total area of the apertures 136 (e.g., removed surface area of the outer surface of the sidewall 160) is 15 to 40% of the area of the sidewall 160 with apertures 136 (e.g., half of the portion or extent of sidewall along central axis A as discussed herein and illustrated in the FIGS. 4A-5 for the outer surface area of the sidewall 160), including 30 to 80%, including 40 to 70%, including 40 to 60%, including 50%, including any value in-between. Accordingly, the ratio between the total area of the apertures 136 (e.g., removed surface area of the outer surface of the sidewall 160) and the area of the portion of the sidewall 160 with apertures 136 (e.g., half of the portion or extent of sidewall along central axis A as discussed herein and illustrated in the FIGS. 4A-5 for the outer surface area of the sidewall 160) can be 0.3 to 0.8, including 0.4 to 0.7, including 0.4 to 0.6, including 0.50, including any value in-between.

In some embodiments, the space between adjacent apertures can be between 0.25 to 1 inch, including 0.5 to 0.75 inches, including any value in-between, so as to enhance structural strength of the housing while at the same time improve airflow. In some embodiments, the amount of material of the sidewall 160 between perimeters or peripheries of the apertures 136 can correspond to a distance or extent of material of the sidewall between the perimeters or peripheries of the apertures 136 being between 1/32 to 1/2 inches, including 1/16 to 1/4 inches, including 1/8 inches, and including any value in-between. In some cases, the diameter of the apertures can be 1/32 to 2 inches, including 1/32 to 2 inches, including 1/16 to 1/2 inches, including 1/8 to 1/4 inches, and including any value in-between.

In some embodiments, the compressive strength of the sidewall of the housing and/or the torsional strength of the sidewall of the housing is 1.25 to 5 times or more stronger than industry standard attic fans.

Figure 6D:
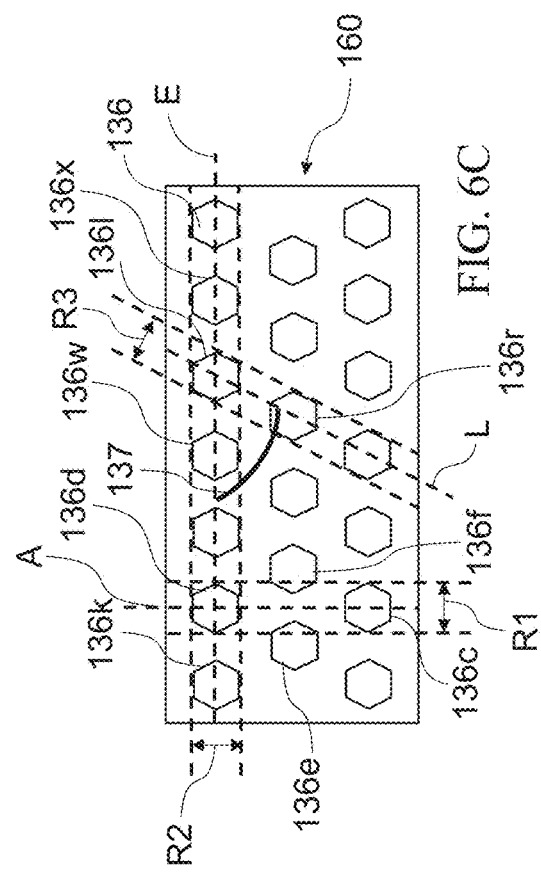
Figure 6E:
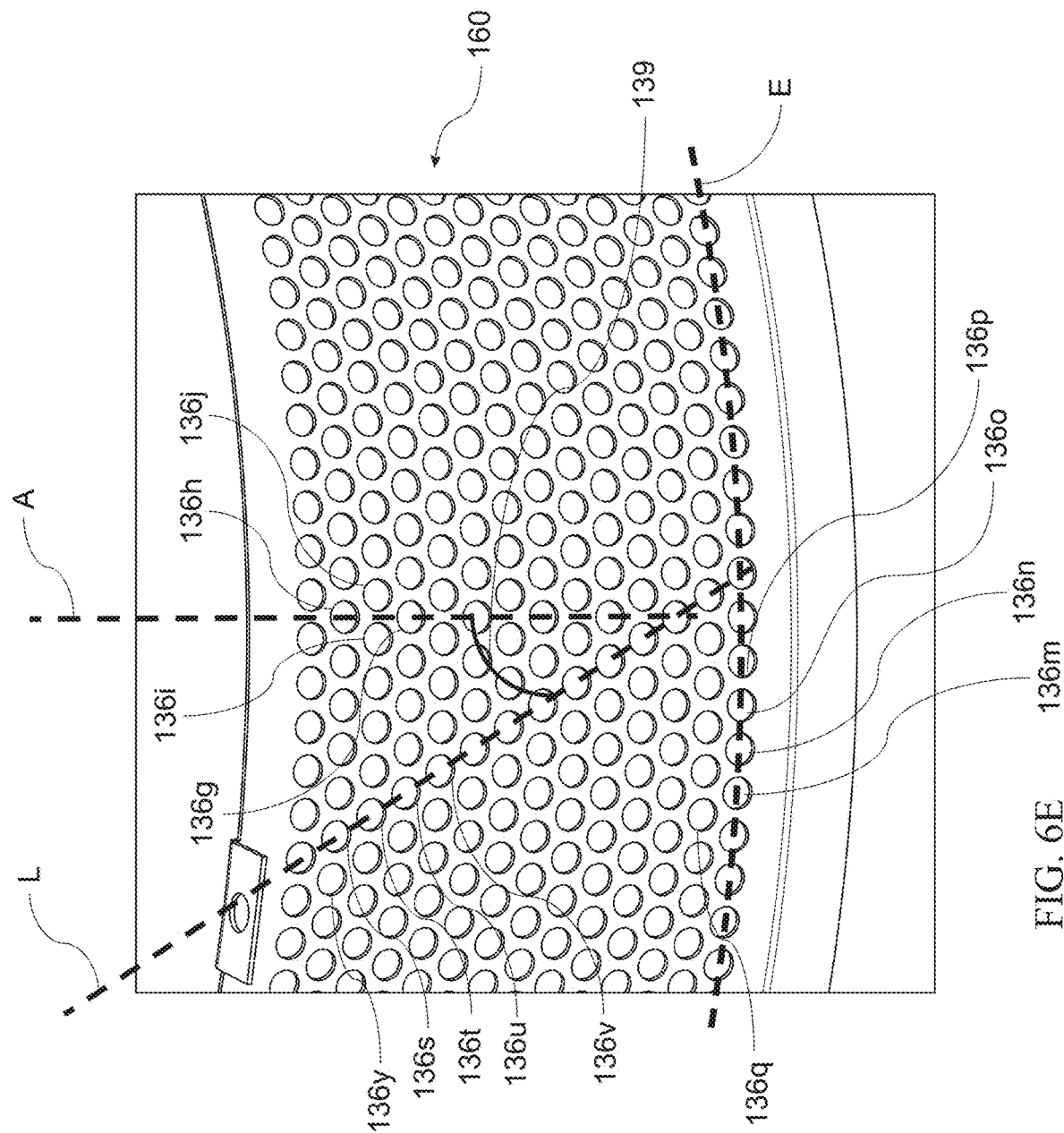
FIG. 6E shows a close-up view of the apertures of the attic fan assembly of FIG. 5.

In some embodiments, the apertures 136 can be positioned in circular patterns 143 with at least one ring of apertures 136 surrounding a central aperture 136g as shown in FIG. 6D. In some embodiments, the apertures 136 can be positioned in at least two rows with each aperture 136a positioned above the corresponding aperture 136b in the row below it, as shown in FIGS. 6A and 6B. Accordingly, the apertures can be arranged in rows (e.g., along extent E discussed herein) and columns (e.g., along extent A discussed herein) as illustrated in FIGS. 6A and 6B.

In some embodiments, the apertures 136 can be positioned, displaced, or offset from each other or displaced relative to each other along central axis A of the housing 120, first opening 152, and/or second opening 156. The central axis A of each of the housing 120, first opening 152, and second opening can coincide with other of two of the housing 120, first opening 152, and second opening. The central axis A can be an extent (e.g., vertical extent in certain orientations) of the sidewall 160 along the central axis A, as for example illustrated in FIG. 6C.

As shown in FIG. 6C, apertures 136c, 136d are offset or displaced from apertures 136e, 136f along central axis A. In some embodiments, the apertures 136 can also be aligned along central axis A. As illustrated in FIG. 6C, apertures 136c, 136d can be aligned along central axis A. The center points of apertures 136c, 136d can align along central axis A. The circumferences, perimeters, or boundaries of apertures 136c, 136d align along central axis A with circumferences, perimeters, or boundaries of the other apertures overlapping or being positioned in the area or region R1 defined by the perimeters of circumferences, perimeters, or boundaries of apertures 136c, 136d. For example, with reference to FIG. 6C, the perimeters or boundaries of apertures 136e, 136f are in, extend into, or overlap into the region R1 defined by perimeters or boundaries of apertures 136c, 136d along central axis A, while the center points of apertures 136e, 136f are not on the central axis A or the center points of apertures 136e, 136f are offset from central axis A. Accordingly, apertures 136c, 136d are offset from apertures 136e, 136f along central axis A (with perimeters of apertures 136c, 136d at least partially and perimeters of apertures 136e, 136f fully in region R1), while apertures 136c, 136d are aligned along central axis A. Apertures 136c, 136d, 136e are along the central axis, while aperture 136e is displaced or offset from aperture 136c and/or aperture 136d along central axis A or relative the central axis A. Apertures 136c 136d, 136f are along the central axis A, while aperture 136f is displaced or offset from aperture 136c and/or aperture 136d along central axis A or relative the central axis A. Apertures 136c and aperture 136d are along central axis A and are also aligned along central axis A (e.g., the center points of apertures 136c, 136d are on the central axis A). This configuration is possible for any number of apertures 136, for example two or more apertures 136 or four or more apertures 136.

As illustrated in FIG. 6E, apertures 136g, 136h can be aligned along central axis A. Alignment of any of the apertures along central axis A can be considered a symmetrical pattern along an extent of the sidewall 160 along the central axis A or between the first opening 152 and the connecting area 168. The center points of apertures 136 can be aligned along central axis A. As illustrated in FIG. 6E, the center points of apertures 136g, 136h can align along central axis A.

The circumferences, perimeters, or boundaries of apertures 136g, 136h align along central axis A with circumferences, perimeters, or boundaries of the other apertures overlapping or being positioned in the area or region R1 defined by the perimeters of circumferences, perimeters, or boundaries of apertures 136g, 136h. For example, with reference to FIG. 6E, the perimeters or boundaries of apertures 136i, 136j are in, extend into, or overlap into the region R1 defined by perimeters or boundaries of apertures 136g, 136h along central axis A, while the center points of apertures 136i, 136j are not on the central axis A or the center points of apertures 136i, 136j are offset from central axis A. Accordingly, apertures 136g, 136h are offset from apertures 136i, 136j along central axis A (with perimeters of apertures 136g, 136h at least partially and perimeters of apertures 136i, 136j fully in region R1), while apertures 136g, 136h are aligned along central axis A. Apertures 136g, 136h, 136i are along the central axis, while apertures 136i is displaced or offset from aperture 136g and/or aperture 136h along central axis A or relative the central axis A. Apertures 136g, 136h, 136j are along the central axis, while aperture 136j is displaced or offset from aperture 136g and/or aperture 136h along central axis A or relative the central axis A. Apertures 136g and aperture 136h are along central axis A and are also aligned along central axis A (e.g., the center points of apertures 136g, 136h are on the central axis A).

As illustrated in FIGS. 6C and 6E, the apertures 136 can be in the sidewall 160 along a circumference or extent E of the sidewall 160 (e.g., horizontal extent in certain orientations). For example, apertures 136d, 136k, 136l are in the sidewall 160 along extent E as illustrated in FIG. 6C. Apertures 136m, 136n, 136o, 136p are in the sidewall 160 along extent E as illustrated in FIG. 6E. The extent E extends perpendicular to the central axis A, as shown in FIGS. 6C and 6E. The extent E is illustrated in FIG. 6E as corresponding to the circumference of the sidewall 160 of the housing 120 and is illustrated as curved to extend circularly about the surface of the sidewall 160 of the housing 120.

As illustrated in FIG. 6C, the center points of apertures 136d, 136k, 136l can align along extent E. As illustrated in FIG. 6E, the center points of apertures 136m, 136n, 136o, 136p can align along extent E. Accordingly, the circumferences, perimeters, or boundaries of apertures 136d, 136k, 136l or apertures 136m, 136n, 136o, 136p align along extent E without circumferences, perimeters, or boundaries of the other apertures that are not aligned along extent E overlapping or being positioned in the area or region R2 defined by the perimeters of circumferences, perimeters, or boundaries of apertures 136d, 136k, 136l or apertures 136m, 136n, 136o, 136p. For example, with reference to FIG. 6C, the perimeters or boundaries of apertures 136e, 136f are not in the region R2 defined by perimeters or boundaries of apertures 136d, 136k, 136l along the extent E. With reference to FIG. 6E, the perimeter or boundary of aperture 136q is not in the region R2 defined by perimeters or boundaries of apertures 136m, 136n, 136o, 136p along the extent E. In some embodiments, the apertures 136 can be positioned offset from each other or displaced relative to each other along extent E, as for example, illustrated along central axis A in FIGS. 6C and 6E.

As illustrated in FIGS. 6C and 6E, the apertures 136 can be aligned along a line L extending at an angle offset from the central axis A. As illustrated in FIGS. 6C and 6E, apertures 136l, 136r or apertures 136s, 136t, 136u, 136v can be aligned along line L. The center points of apertures 136 can be aligned along line L. As illustrated in FIGS. 6C and 6E, the center points of apertures 136l, 136r or apertures 136s, 136t, 136u, 136v can align along line L. Accordingly, the circumferences, perimeters, or boundaries of apertures 136l, 136r or apertures 136s, 136t, 136u, 136v align along line L without circumferences, perimeters, or boundaries of the other apertures that are not aligned along line L overlapping or being positioned in the area or region R3 defined by the circumferences, perimeters, or boundaries of apertures 136l, 136r or apertures 136s, 136t, 136u, 136v. For example, with reference to FIG. 6C, the perimeters or boundaries of apertures 136w, 136x are not in the region R3 defined by perimeters or boundaries of apertures 136l, 136r along the line L. With reference to FIG. 6E, the perimeter or boundary of aperture 136y is not in the region R3 defined by perimeters or boundaries of apertures 136s, 136t, 136u, 136v along the line L. In some embodiments, the apertures 136 can be positioned offset from each other or displaced relative to each other along line L, as for example, illustrated along central axis A in FIGS. 6C and 6E.

Line L can be offset from extent E. As illustrated in FIG. 6C, line L can be offset from extent E A at angle 137. Angle 137 can be an acute angle. The angle 137 can be between 10 to 80 degrees, including 20 to 70, 30 to 50, including 45 degrees, including any value in-between.

Line L can be offset from central axis A. As illustrated in FIG. 6E, line L can be offset from central axis A at angle 139. Angle 139 can be an acute angle. The angle 139 can be between 10 to 80 degrees, including 20 to 70, 30 to 50, including 45 degrees, including any value in-between. Angle 139 can be the complement of angle 137.

Any number of apertures 136 is possible, for example two or more apertures 136 or four or more apertures 136. The apertures 136 can be formed in any configuration, examples of which are shown in FIGS. 6A-6E. As illustrated in FIG. 5, many hundreds or thousands of apertures 136 can be provided in the sidewall 160. Using many, relatively small, apertures in the sidewall can increase rigidity and strength of the housing 120. For example, more of the material of the sidewall 160 (from the sheet of material) can remain after formation of the apertures. The more material, the more rigid and stronger the housing 120.

The apertures 136 can be positioned in certain patterns and have certain shapes as discussed herein to facilitate increasing the rigidity and strength of the housing. For example, certain patterns and certain shapes of the apertures 136 can facilitate in distributing along the sidewall 160 forces that can be applied to the housing 120 during manufacture, installation, or operation. Certain patterns and certain shapes of the apertures 136 as discussed herein can allow for rigidity and strength while providing for airflow through the housing 120 and inhibiting entrance of environment debris or animals. Certain patterns and certain shapes of the apertures 136 can be in the form of a net that is formed directly in the sidewall/housing that allows for airflow while keeping certain environment or animals debris out. For example, the size and configuration of the apertures 136 will distribute any integrity lost in the housing 120 over a larger area and will not leave larger sections of the housing with lower structural support.

In other attic fans where windows with mesh are used, larger portions of the sidewall would need to be removed in order to allow for the windows with mesh, which can decrease the rigidity strength of the overall housing. Further, the mesh may come lose and cause damage. The mesh may partially come lose and vibrate during operation of the attic fan, causing undesired noise and vibration. The elimination of the use of windows with mesh per the present disclosure of the attic fan assembly 108 can improve the overall manufacturing process by improving efficiency and costs while increasing structural integrity and strength of the attic fan assembly as disused herein. For example, there can be only the one step of stamping or forming the apertures 136, and no additional materials or structures will be needed to be formed or assembled for the housing/sidewall. For example, the apertures 136 are formed from the material of the housing/sidewall 120/160 itself, rather than a separate material or structure (such as netting or chicken wire) that is then attached to the housing/sidewall 120/160. Accordingly, the arrangement of the apertures 136 can also provide more structural support for the overall attic fan assembly 108 by maintaining the integrity of the housing 120) as discussed herein (e.g., integrity via the remaining material of the housing 120 after forming the apertures 136 in the housing 120).

In some embodiments, the apertures 136 can be in certain portions of the housing 120. For example, the apertures 136 can be on the sidewall 160 on half or less than half of the extent of the sidewall 160 (e.g., along central A). In some embodiments, the apertures 136 can be in any part of the sidewall 160 of the housing 120, including majority of the sidewall 160. The apertures 136 can be formed in the sidewall 160 to extend around the circumference of the housing 120 as illustrated in FIG. 5. The connection portion 168 where the ends of the sheet of material of the sidewall 160 are joined as discussed herein can exclude apertures 136. Not including apertures 136 at the connection portion 168 can help increase the integrity of the joint of the ends of the sheet of material as well as the overall strength and integrity of the housing 120.

The apertures 136 can be stamped into the sheet of material forming the sidewall 160 of the housing 120. By stamping the apertures 136, the manufacturing process can be cheaper, easier and quicker. In some embodiments, the apertures 136 can be cut (e.g., laser cut) into the sheet of material forming the sidewall of the housing 120. In some embodiments, each individual aperture 136 can be formed separately. In some embodiments, the housing 120 can be formed using other suitable manufacturing process. For example, plastic or other polymer material as discussed herein can be formed using injection molding. In some cases, the apertures 136 can be formed in the sidewall 160 via stamping tools, rotary die, and/or a CNC machines, such as for example laser, plasma cutter, water jet, turret punch, etc.

Figure 7:
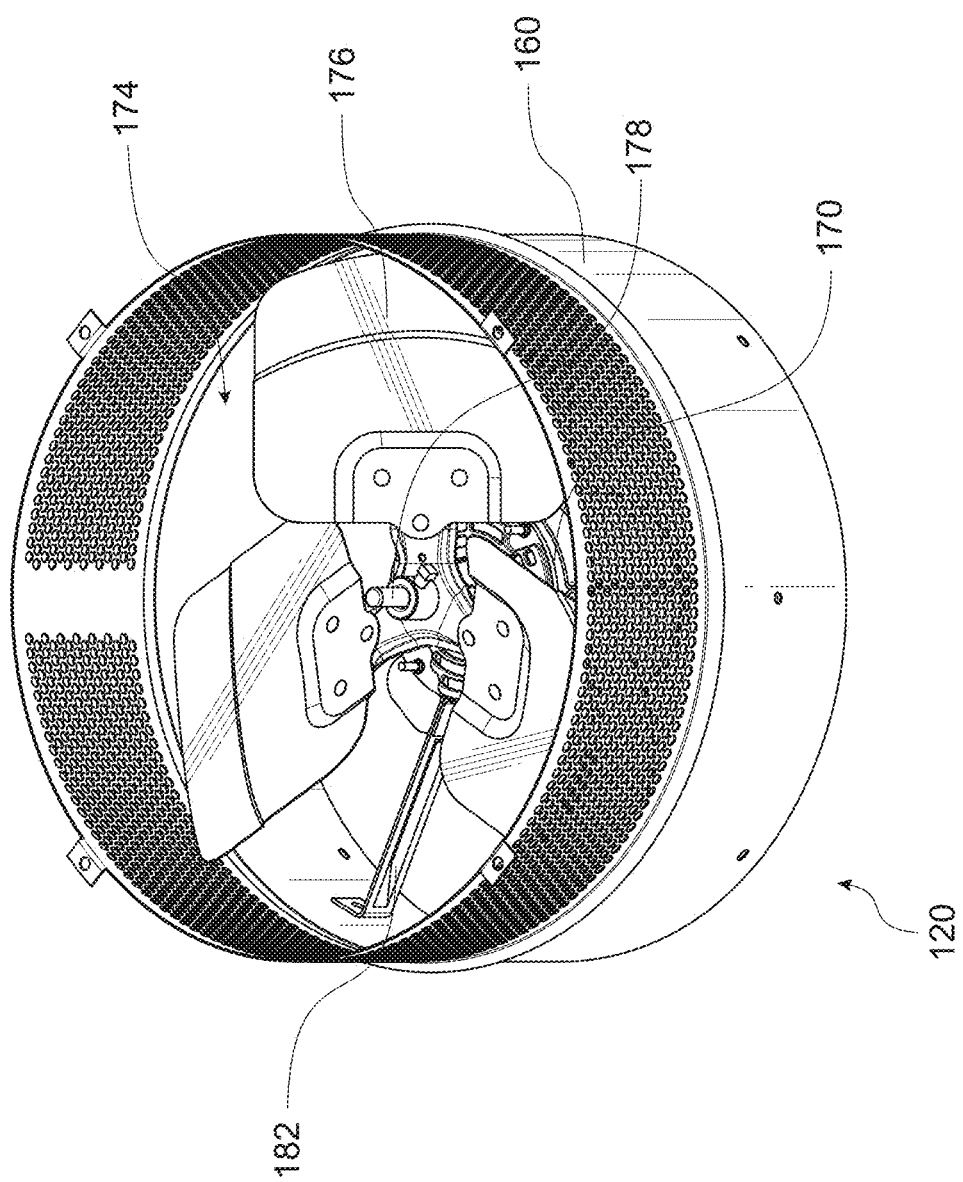
FIG. 7 shows a housing of an attic fan assembly with a fan blade assembly.

FIG. 7 shows the housing 120 with a motor 170 and fan blade assembly 174 located or disposed within the housing 120. The motor 170 can rotate a fan drive shaft 178 which can than rotate the fan blade assembly 174. The fan blade assembly can include blades 176. Any suitable number of blades 176 can be used. For example, two, three, four or more. The fan blade assembly 174 can be connected to the housing via connectors or supports 182. The connectors 182 can be connected to the internal side of the sidewall 160. The fan blade assembly 174 can have two, three, four or more connectors. In some embodiments, the motor 170 can be connected to the cover 124 via supports, screws, welding, etc. The cover 124 can then be connected to the sidewall 160 as discussed herein to position or dispose the motor 170 (and fan blade assembly 174) within or inside the housing 120 and/or sidewall 160.

Figure 8:
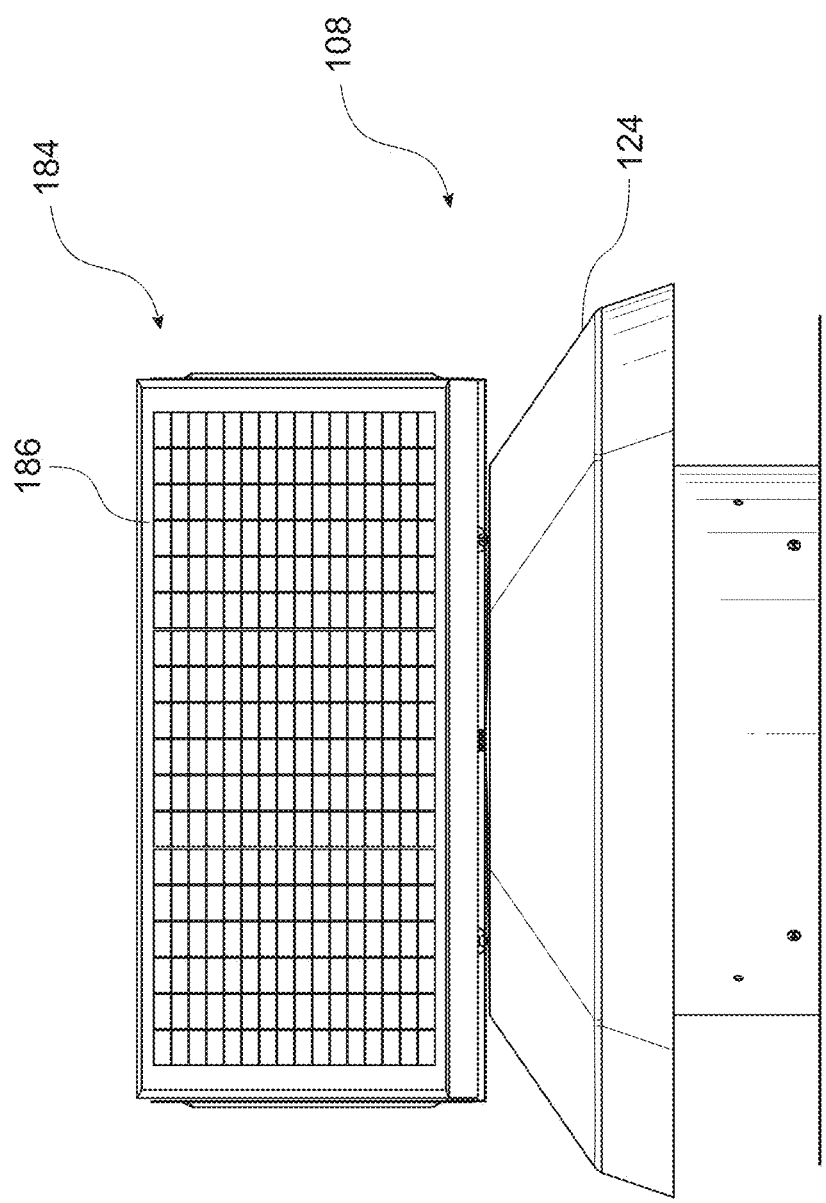
FIG. 8 shows an attic fan assembly with a solar panel.
Figure 9:
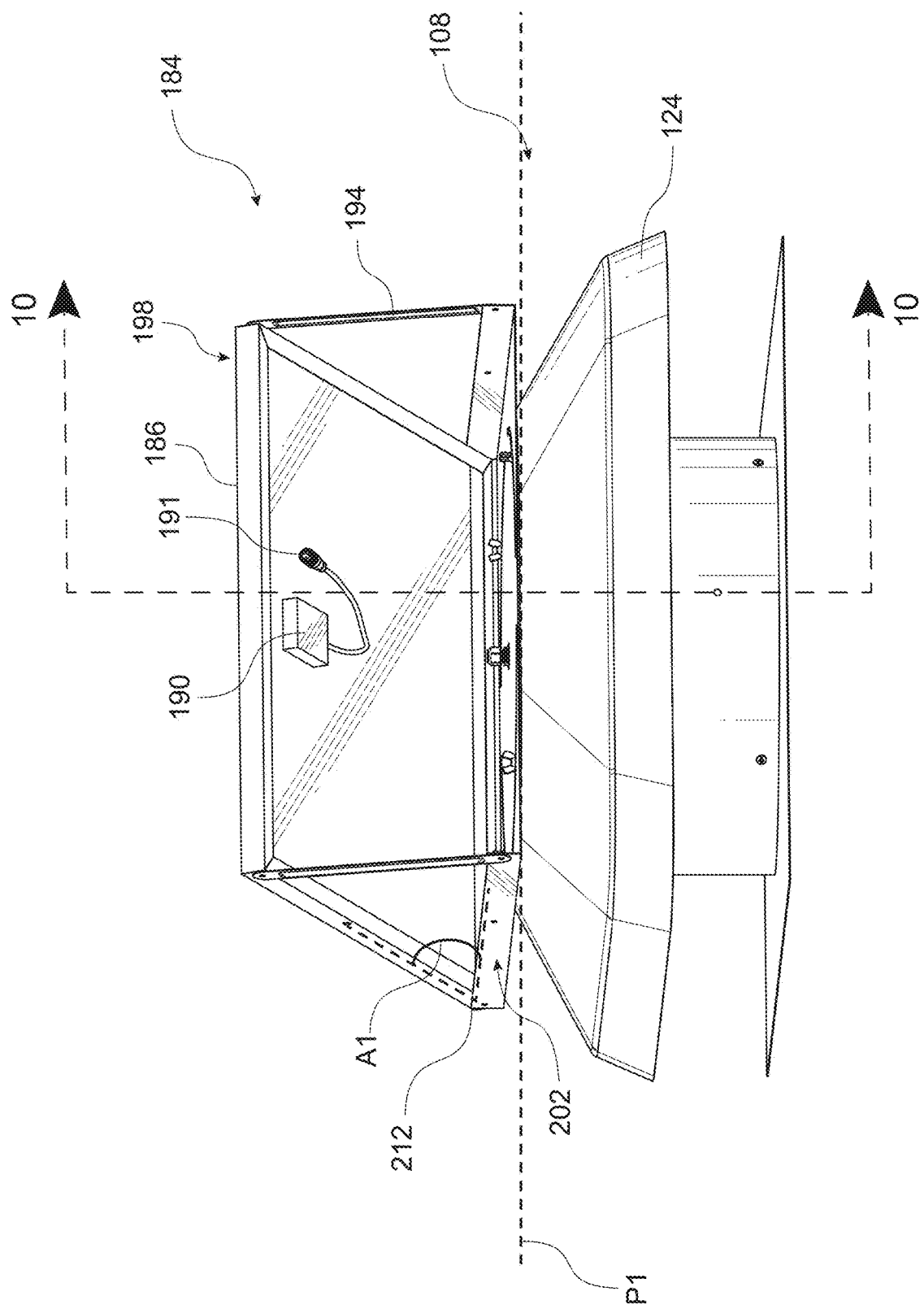
FIG. 9 is another view of the attic fan assembly of FIG. 8.
Figure 10:
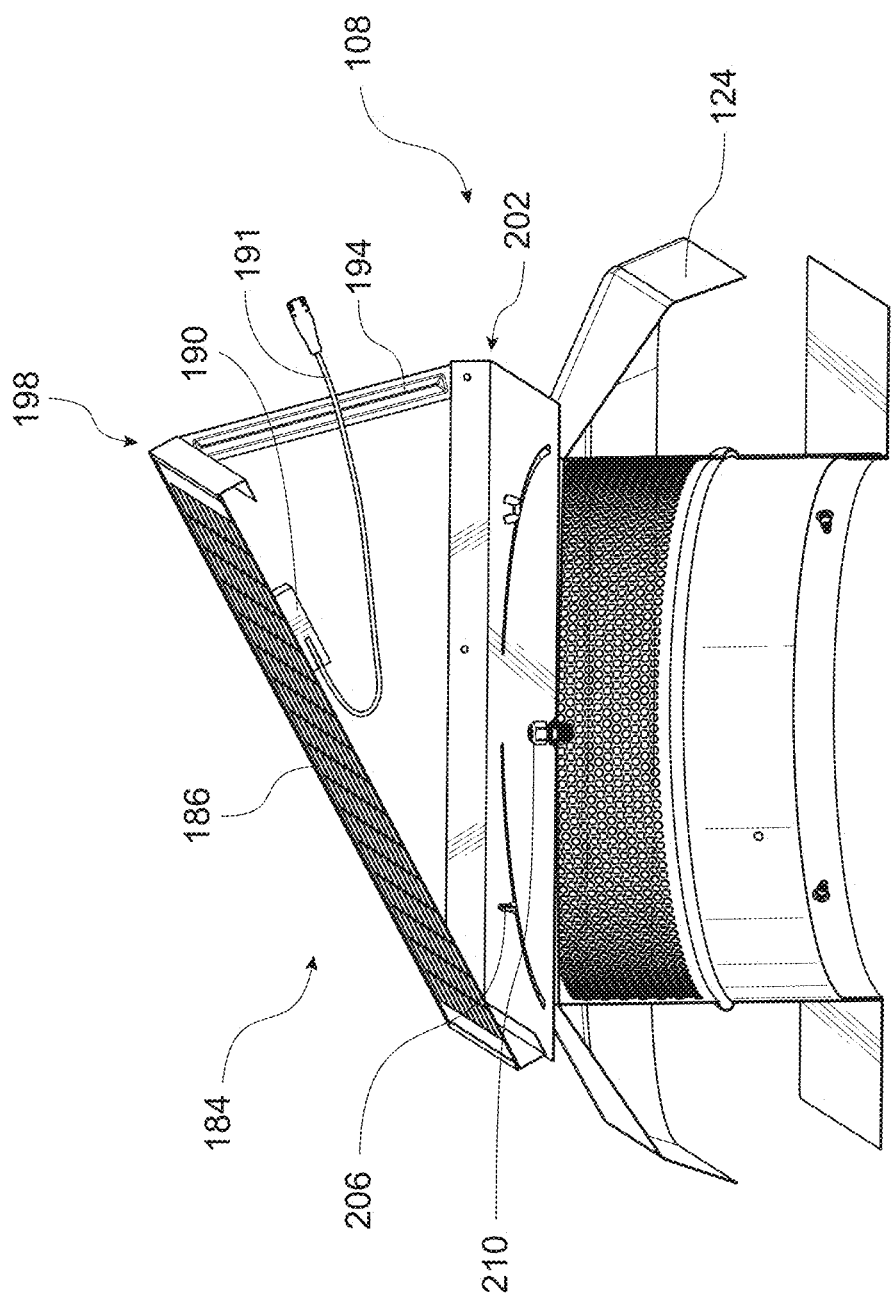
FIG. 10 is a perspective view of a cross-section of the attic fan assembly as shown in FIG. 9.

FIGS. 8-10 shows an example embodiment of an attic fan assembly 108 having a solar panel assembly 184. The solar panel assembly 184 can be used to help power the motor 170 of the attic fan assembly 108. The solar panel assembly 184 can have any number of solar panels 186. The solar panel assembly 184 can be attached to the cover 124 of the attic fan assembly 108. In some embodiments, the solar panels 186 can be positioned directly on top of the cover 124. In other embodiments, the solar panel assembly 184 can be positioned at angles above the cover 124.

The solar panel assembly 184 can have an electrical junction 190 with a connecting wire 191 attached to the back side of the solar panel 186. The solar panel assembly 184 can have a first housing piece or portion 198 and a second housing piece or portion 202. The solar panels 186 can be attached to the first piece 198. The second piece 202 can be connected to the cover 124 and/or housing 120 via fasteners 206. Any suitable numbers of fasteners 206 can be used. The openings in the second piece 202 can correspond to the tabs 164. The solar panel assembly 184 can be attached to the housing 120 similar as discussed herein for the cover 124 connecting to the housing 120. The housing 120 as discussed herein can have sufficient strength to support the solar panel assembly 184.

In some embodiments, a central fastener 210 can be used to connect the second piece 202 to the cover 124. The central fastener 210 can be used for alignment, for example, the central fastener 210 can help ensure the solar panels 186 are facing the intended direction. In some embodiments, the same fasteners 206 can be used to connect the solar panel assembly 184 and the cover 124 to the housing 120. The housing 120 can be strong enough to support both the solar panel assembly 184 and the cover 124 without the use of additional brackets or connectors.

The first piece 198 and the second piece 202 can be connected at a first edge 212 and by supports 194 forming a generally triangular shape. The supports 194 can be connected at one end to the first piece 198 and at a second end to the second piece 202. The second piece 202 can be connected to the cover as described above. The supports 194 can be used to angle the solar panels 186 relative to a horizontal plane P1 of the cover 124. The supports 194 can allow for the first piece 198 to be closed for installation of transportation. For example, the supports 194 can be removed to allow the first piece 198 to be removed or closed to lay on top of the second piece 202. This can protect the solar panel assembly from damage during installation or transportation. Additionally, the supports 194 and the first piece 198 being removable or adjustable allow for the solar panels 186 to be positioned in the appropriate position for each roof which vary from roof to roof. For example, the solar panels 186 can be configured to face a specified direction or the solar panels 186 can be positioned at an angle A1.

Figure 11:
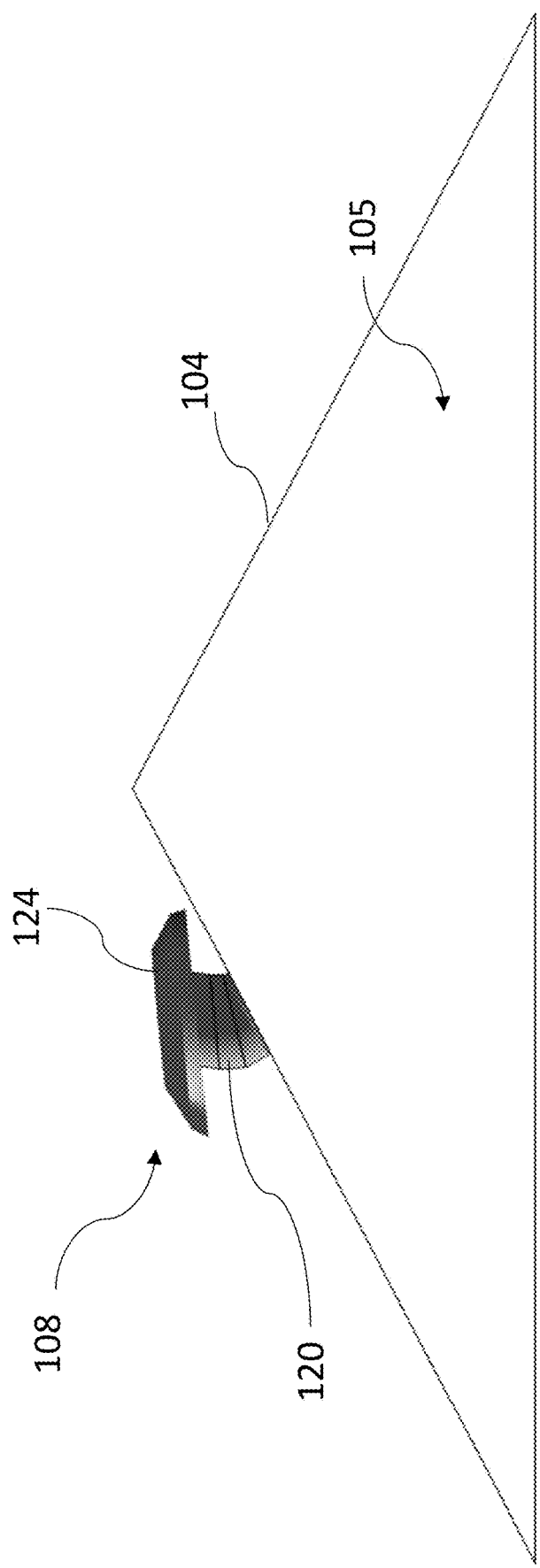
FIG. 11 shows an attic fan assembly at an angle relative to a roof of a structure.

FIG. 11 shows an attic fan assembly 108 at an angle relative to a roof 104 of a structure 100. In order to keep debris and environmental elements out of the attic fan assembly 108 as discussed herein, the angle of the cover 124 may need to be adjusted or changed relative to the roof 104. For example, in FIG. 1, a longitudinal extent of the cover 124 is illustrated to be generally parallel upper surface of the roof 104. Having the cover 124 be parallel relative to the roof 104 can be sufficient or satisfactory when the pitch of the roof 104 is below or at a certain ratio.

Figure 12:
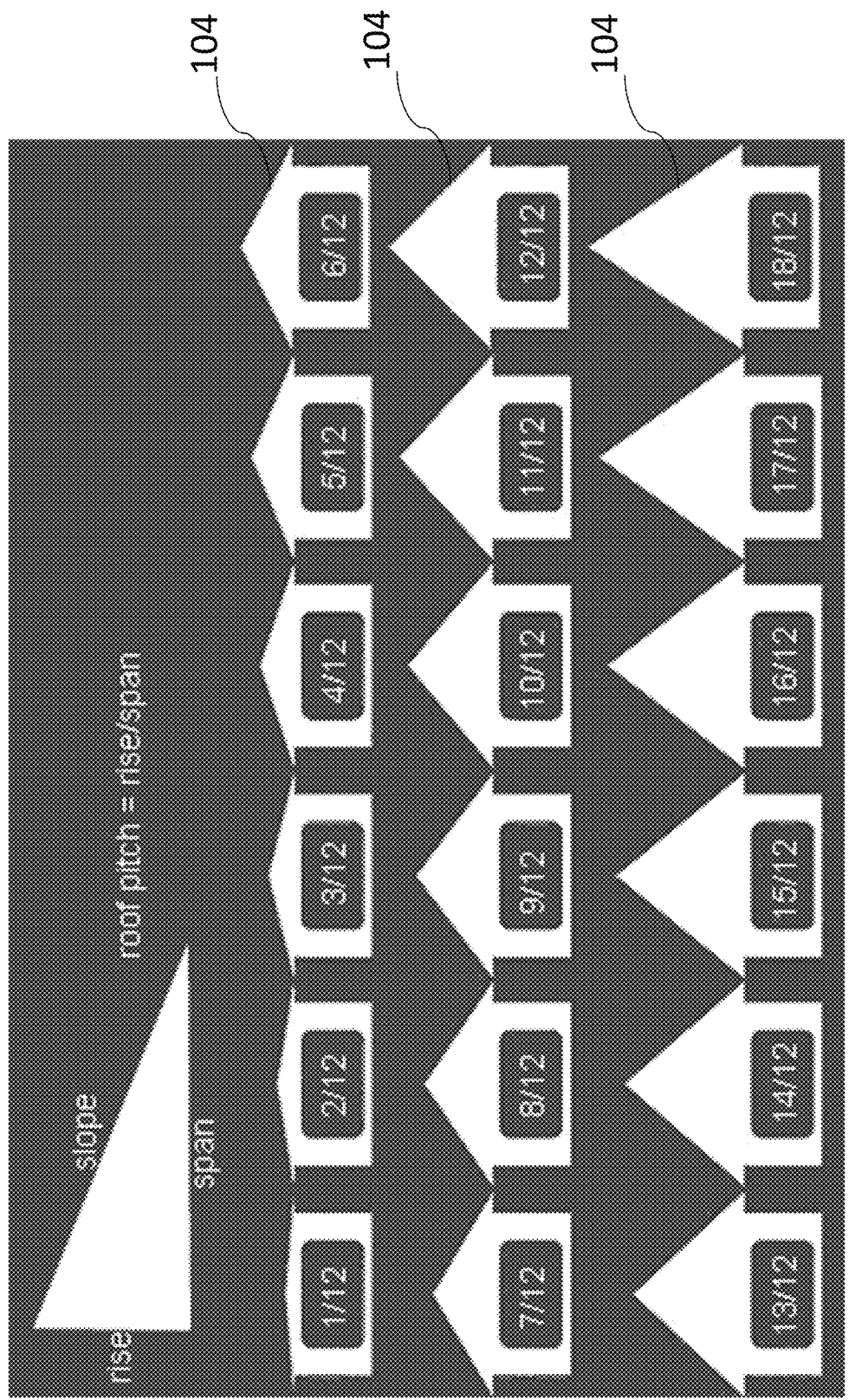
FIG. 12 shows various roof pitches for structures.

FIG. 12 shows various roof pitches for structures 100. The roof pitch can be considered the vertical rise over horizontal span of the roof surface, providing the slope of the roof 104. In some embodiments, the roof pitch can be up to $6/12$ for a cover 124 that is parallel relative to the roof 104. For roof pitches greater than or equal to $7/12$, the angle of the cover 124 may be adjusted relative to the roof 104 depending on roof pitch of the roof 104. Such an adjustment can allow for installation of the attic fan assembly 108 on roofs with roof pitches between $7/12$ to $18/12$ illustrated in FIG. 12 or greater. In some embodiments, the angle of the cover 124 relative to the roof 104 can also be adjusted for roof pitches less than $7/12$, such as $6/12$, $5/12$, etc.

Figure 13:
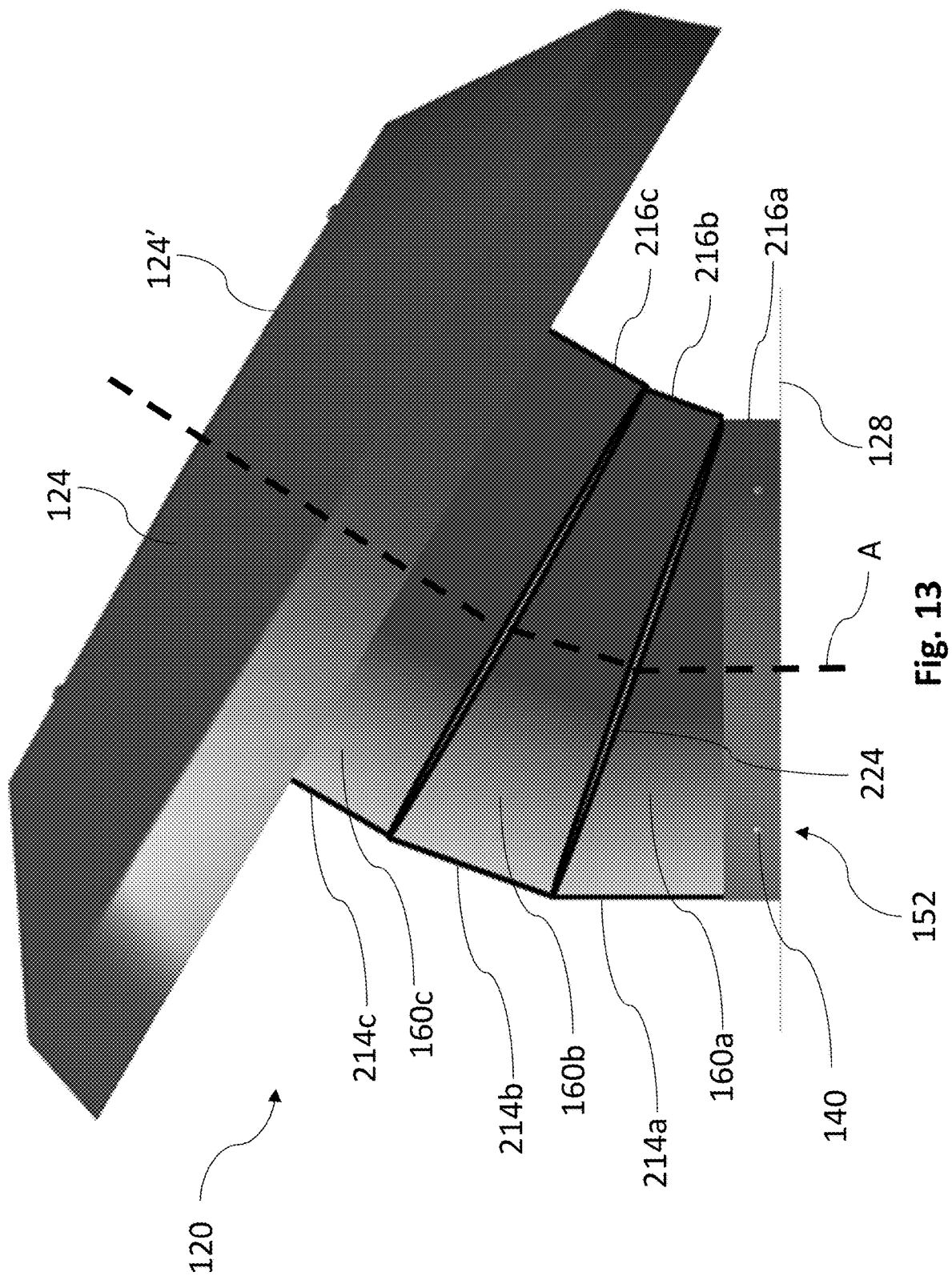
FIGS. 13 and 14 show an attic fan assembly that can have the angle of the cover adjusted.
Figure 14:
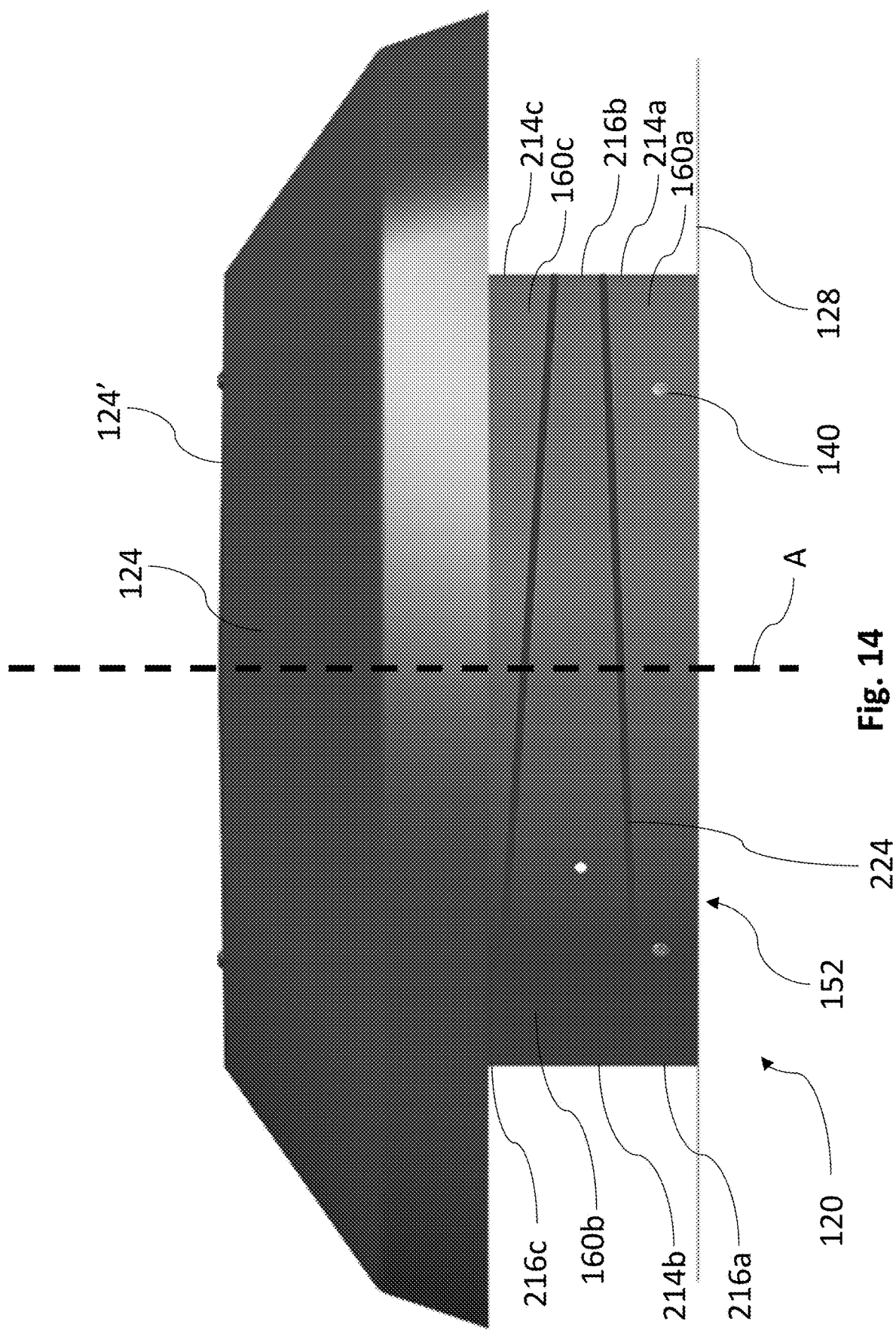

FIGS. 13 and 14 show an attic fan assembly 108 that can have the angle of the cover 124 adjusted. In some embodiments, the sidewall 160 of the housing 120 can have sections to form an adjustable sidewall 160. For example, the sidewall 160 can have a first wall or section 160a, a second wall or section 160b, and a third wall or section 160c connected to each other. In some embodiments, the attic fan assembly 108 can have four sections as discussed herein in reference to FIG. 16. The first section 160a, the second section 160b, and/or the third section 160c can be rotatably or moveably connected about central axis A to each other. In some embodiments, the first section 160a can be connected to a flashing 128 via fasteners 140 as discussed herein. In some embodiments, the third section 160c can have apertures 136 discussed herein and form the second end 142 as discussed herein. The third section 160c can be connected to the cover 124. Accordingly, an angle along the central axis A between the first end 141 and the second end 142 can be adjusted or changed to adjust or change the angle between the first opening 152 and the second opening 156 along the central axis A. In some embodiments, the attic fan assembly 108 can have two sections 160a, 160c, without the other section 160b. The two sections 160a, 160c can connected by one joint (e.g., flange 222 and channel 224 as discussed herein) and function to provide varying angles between 1 to 45 degrees as discussed herein, depending on the angle of the joint between the two sections 160a, 160c.

The first section 160a, the second section 160b, and/or the third section 160c can be rotated relative to teach other about central axis A to adjust the angle of the cover 124 and extent of the housing 120 as illustrated in FIG. 13. One or more of the first section 160a, the second section 160b, or the third section 160c can have a long or longer extent portion 214a, 214b, 214c (respectively) of the sidewall 160 along the central axis A (for each section 160a, 160b, 160c) relative to a short or shorter extent portion 216a, 216b, 216c (respectively) of the sidewall 160 along the central axis A (for each section 160a, 160b, 160c). Each of the perimeters of the first section 160a, the second section 160b, and the third section 160c can gradually extend between long extent 214a, 214b, 214c (respectively) and the short extent 216a, 216b, 216c (respectively). Each of the long extent 214a, 214b, 214c can be positioned opposite the respective short extent 216a, 216b, 216c along a diameter of each section 160a, 160b, 160c.

As illustrated in FIG. 13, when sections 160a, 160b, 160c are rotated relative to each other about central axis A such that long extent 214a is opposite short extent 216b (along the diameter of housing 120) and short extent 216b is opposite long extent 214c (along the diameter of housing 120), the sidewall 160 of the housing 120 forms an angle such that a longitudinal extent of the cover 124 is at an angle relative to the surface of the roof 104. Stated differently, when sections 160a, 160b, 160c are rotated relative to each other about central axis A such that short extent 216a is opposite long extent 214b (along the diameter of housing 120) and long extent 214b is opposite short extent 216c (along the diameter of housing 120), the sidewall 160 of the housing 120 forms an angle such that a longitudinal extent of the cover 124 is at an angle relative to the surface of the roof 104. Accordingly, when one or more of the long extents 214a, 214b, 214c and one or more short extents 216a, 216b, 216c are aligned along the central axis A, the angle of the cover 124 relative to the roof 104 is adjusted. The angle of a longitudinal extent of the cover 124 (e.g., along a top or exterior surface 124' of the cover 124 perpendicular to central axis A) relative to the surface of the roof 104 as discussed herein can also be considered an angle relative to the surface of the flashing 128. As illustrated in FIG. 13, the angle of a longitudinal extent of the cover 124 relative to the surface of the flashing 128 (and the surface of the roof 104 when installed) can be about 45 degrees.

For some configurations depending on the roof pitch, just one or two of the sections 160a, 160b, 160c (or more depending on the number of sections of the sidewall 160 as discussed herein) can be rotated to provide a varied angle (of the cover 124 relative to the roof 104) that is less than when all sections 160a, 160b, 160c are rotated relative to each other as discussed in reference to FIG. 13. For example, just the first section 160a can be rotated relative to the other section 160b, 160c such that the long extent 214a is opposite the short extent 216b and long extent 214c. Similarly, just the third section 160c can be rotated relative to the other section 160a, 160b such that the long extent 214c is opposite the short extent 216b and long extent 214a. Accordingly, the angle of a longitudinal extent of the cover 124 relative to the surface of the flashing 128 can be less than 45 degrees as discussed herein. For example, the angle of a longitudinal extent of the cover 124 relative to the surface of the flashing 128 can be about 22.5 degrees. Depending on the rotation of the just one of the sections 160a, 160b, 160c, any angle between 1 to 22.5 degrees can be achieved. Similarly, depending on the rotation of two or more sections 160a, 160b, 160c, any angle between 22.5 to 45 degrees can be achieved.

For some configurations depending on the roof pitch, one of the sections 160a, 160b, 160c of the sidewall 160 can be rotated less than 180 degrees to form an angle of a longitudinal extent of the cover 124 relative to the surface of the flashing 128 less than 22.5 degrees. For some configurations depending on the roof pitch, one of the sections of sidewall 160 can be rotated 180 degrees while another section of the sidewall 160 can be rotated less than 180 degrees to form an angle of a longitudinal extent of the cover 124 relative to the surface of the flashing 128 between 22.5 and 45 degrees. Accordingly, the angle of a longitudinal extent of the cover 124 relative to the surface of the flashing 128 can be varied depending on the roof pitch by rotating the one or more sections 160a, 160b, 160c of the sidewall 160 a desired or predetermined amount along central axis A relative to each other to form various angles. As discussed herein in reference to rotation and position/angle of sections 160a, 160b, 160c, the central axis A can be specific to each of the sections 160a, 160b, 160c as illustrated in FIG. 14 with the central axis A extending along the respective extent of sections 160a, 160b, 160c specific to the position/angle of each of the sections 160a, 160b, 160c relative to each other. See also the central axis A of adjustable joint 218a and 220a as discussed herein for FIGS. 15 and 16.

As illustrated in FIG. 14, when sections 160a, 160b, 160c are rotated relative to each other about central axis A such that long extent 214a is opposite long extent 214b (along the diameter of housing 120) and long extent 214b is opposite long extent 214c (along the diameter of housing 120), the sidewall 160 of the housing 120 forms a straight extent along the central axis A such that a longitudinal extent of the cover 124 is generally parallel to the flashing 128 or the surface of the roof 104. Stated differently, when sections 160a, 160b, 160c are rotated relative to each other about central axis A such that short extent 216a is opposite short extent 216b (along the diameter of housing 120) and short extent 216b is opposite short extent 216c (along the diameter of housing 120), the sidewall 160 of the housing 120 forms a straight extent along the central axis A such that a longitudinal extent of the cover 124 is generally parallel to the flashing 128 or the surface of the roof 104.

Figure 15:
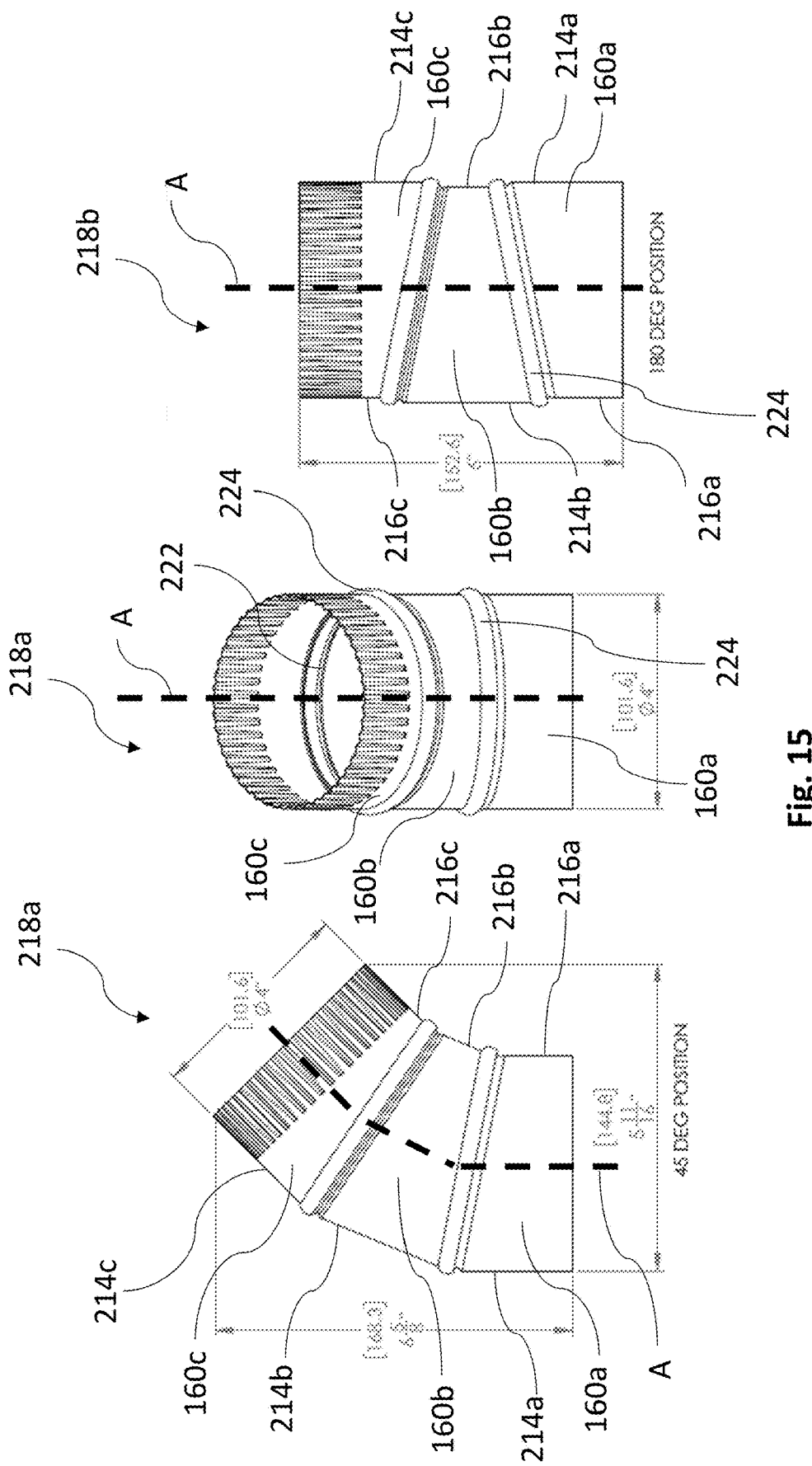
FIG. 15 shows an adjustable joint.

FIG. 15 shows an adjustable joint 218a, 218b. The dimensions illustrated in FIG. 15 are an example embodiment and non-limiting. The adjustable joint 218a, 218b can have first, second, and third sections 160a, 160b, 160c as discussed herein for FIGS. 13 and 14. In some embodiments, the adjustable joint 218a, 218b can be formed to be part of or integral with the housing 120 as illustrated in FIGS. 13 and 14. In some embodiments, the adjustable joint 218a, 218b can be separate from the housing 120. For example, the adjustable joint 218a, 218b can be connected to the housing 120 (e.g., to the sidewall 160 of FIGS. 2 to 5, for example) via fasteners 140 or other connection mechanisms at the connection point discussed herein for the flashing 128 to form a part of the housing 120 as another component of the housing 120. In such a configuration, the flashing 128 can be connected to first section 160a of the adjustable joint 218a, 218b via fasteners 140 or other connection mechanisms.

The adjustable joint 218a of FIG. 15 illustrates the adjustable joint at a 45-degree position as discussed herein for FIG. 13. The adjustable joint 218b of FIG. 15 illustrates the adjustable joint at a 180-degree position or straight as discussed herein for FIG. 14, discussed as being parallel to the surface of the roof 104.

Figure 16:
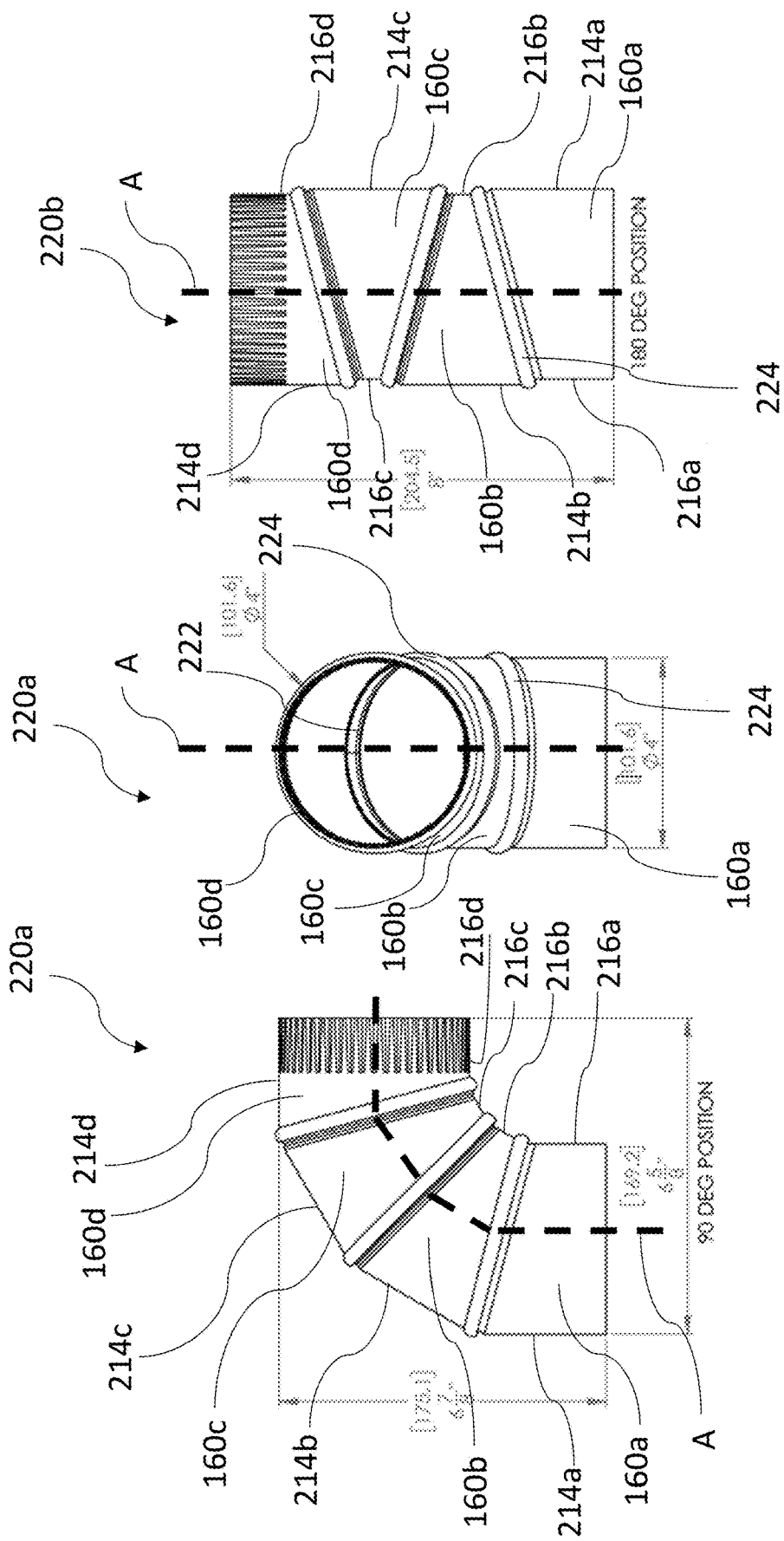
FIG. 16 shows another adjustable joint.

FIG. 16 shows another adjustable joint 220a, 220b. The dimensions illustrated in FIG. 16 are an example embodiment and non-limiting. The adjustable joint 220a, 220b can have first, second, and third sections 160a, 160b, 160c as discussed herein for FIGS. 13, 14, and 15. FIG. 16 shows that the adjustable joint 220a, 220b can have a fourth section 160d with features like the first, second, and third sections 160a, 160b, 160c discussed herein. The fourth section 160d can have a long extent portion 214d and a short extent portion 216d with features like the long extents 214a, 214b, 214c and short extents 216a, 216b, 216c, respectively, discussed herein. The fourth section 160d can allow for further flexibility and range of angles that can be achieved by moving the sections 160a, 160b, 160c, 160d relative to each other as discussed herein. For example, the adjustable joint 218a of FIG. 16 illustrates the adjustable joint at a 90-degree position, achieving a greater angle than as discussed herein for FIG. 13. Depending on the rotation of the just one or more of the sections 160a, 160b, 160c, any angle between 1 to 90 degrees can be achieved. The adjustable joint 218b of FIG. 16 illustrates the adjustable joint at a 180-degree position or straight as discussed herein for FIG. 14, discussed as being parallel to the surface of the roof 104.

At least one of the long extents 214a, 214b, 214c, 214d can have a different length along the central axis A then the other long extents 214a, 214b, 214c, 214d. At least one of the short extents 216a, 216b, 216c, 216d can have a different length along central axis A then the other short extents 216a, 216b, 216c, 216d. For example, as illustrated in FIG. 16, short extent 216a can have a different length then short extent 216b. As another example, short extent 216c can have a different length from short extent 216d. This can allow for varied angles as discussed herein while accommodating connection points to the sidewall 160 and/or flashing 128. At least one of the sections 160a, 160b, 160c, 160d can have a different length along central axis A relative to the other sections 160a, 160b, 160c, 160d.

In some embodiments, the adjustable joint 220a, 220b can be formed to be part of or integral with the housing 120 as illustrated in FIGS. 13 and 14. In some embodiments, the adjustable joint 220a, 220b can be separate from the housing 120. For example, the adjustable joint 220a, 220b can be connected to the housing 120 (e.g., to the sidewall 160 of FIGS. 2 to 5, for example) via fasteners 140 or other connection mechanisms at the connection point discussed herein for the flashing 128 to form a part of the housing 120 as another component of the housing 120. The flashing 128 can be connected to first section 160a of the adjustable joint 220a, 220b via fasteners 140 or other connection mechanisms.

The sections 160a, 160b, 160c, 160d can be connected to each other via a suitable mechanism that allows for rotation or movement of the sections 160a, 160b, 160c, 160d relative to each other. For example, one end of one or more of the sections 160a, 160b, 160c, 160d can have a flange 222 extending radially outwardly from the wall or surface forming the one or more of the sections 160a, 160b, 160c, 160d. The flange 222 can wholly circumscribe the perimeter of the one or more sections 160a, 160b, 160c, 160d to form a continuous flange about the central axis A. The other end of the one or more sections 160a, 160b, 160c, 160d can have a channel or groove 224 extending radially outwardly from the wall or surface forming the one or more of the sections 160a, 160b, 160c, 160d. The channel 224 can wholly circumscribe the perimeter of the one or more sections 160a, 160b, 160c, 160d to form a continuous channel about the central axis A. The channel 224 can be formed by two walls or extensions of the material forming sections 160a, 160b, 160c, 160d. The flange 222 can be positioned between the two walls of the channel 224 to move or slide relative to the two walls for the sections 160a, 160b, 160c, 160d to move relatively to each other as discussed herein. The flange 222 can be positioned within the channel 224 to secure the relative sections the one or more sections 160a, 160b, 160c, 160d along the central axis A while allowing for relative rotational movement of the one or more sections 160a, 160b, 160c, 160d about the central axis A as discussed herein. The flange 222 and channel 224 can form the joint between the various sections 160a, 160b, 160c, 160d discussed herein. Other joint connecting mechanisms that allow relative movement between sections 160a, 160b, 160c, 160d can be used. Depending on the angle of the joint between the long and short extent portions discussed herein, various angles between 1 to 90 degrees can be achieved with two or more of the sections 160a, 160b, 160c, 160d. In some embodiments, the channel 224 can be, can function, and/or form a part of the protrusion 166 as discussed herein to keep environmental debris out of the attic fan assembly 108.

For one or more sections 160a, 160b, 160c, 160d, the flange 222 can be positioned on one end of the one or more sections 160a, 160b, 160c, 160d and the channel 224 can be positioned on the other (opposite) end of the one or more sections 160a, 160b, 160c, 160d. In some embodiments, one or more one or more sections 160a, 160b, 160c, 160d can have on one end the flange 222 or channel 224 and can have on the other (opposite) end a connection mechanism for connecting to the cover 124 and/or flashing 128 as discussed herein.

The foregoing description of the preferred embodiments of the present disclosure has shown, described and pointed out the fundamental novel features of the inventions. The various devices, methods, procedures, systems, assemblies, and techniques described above provide a number of ways to carry out the described embodiments and arrangements. Of course, it is to be understood that not necessarily all features, objectives or advantages described are required and/or achieved in accordance with any particular embodiment described herein. Also, although the invention has been disclosed in the context of certain embodiments, arrangements and examples, it will be understood by those skilled in the art that the invention extends beyond the specifically disclosed embodiments to other alternative embodiments, combination, sub-combinations and/or uses and obvious modifications and equivalents thereof. Accordingly, the invention is not intended to be limited by the specific disclosures of the embodiments herein.

What is claimed is:

1. An attic fan assembly for a roof to cause airflow through an attic of a building structure, the attic fan assembly comprising:
a cylindrical housing comprising:
a first circular opening;
a second circular opening opposite the first circular opening;
a sidewall extending between the first circular opening and the second circular opening, wherein the sidewall is a monolithic material from the first circular opening to the second circular opening;
a plurality of apertures in the monolithic material of the sidewall, wherein two or more apertures of the plurality of apertures are aligned along a central axis of the first circular opening or the second circular opening and provide for airflow from the first circular opening through the plurality of apertures;
a protrusion extending around the cylindrical housing about the central axis, the protrusion configured to inhibit environmental debris from entering the cylindrical housing; and
a single connecting portion extending fully between the first circular opening and the second circular opening along the central axis, the single connecting portion comprising the monolithic material of the sidewall without any of the plurality of apertures in the single connecting portion;
a motor configured to rotate a fan drive shaft, the motor disposed inside the cylindrical housing, the monolithic material of the sidewall supporting the motor inside the cylindrical housing;
a fan blade assembly within the cylindrical housing and secured to the fan drive shaft, wherein the motor and the fan blade assembly are configured to draw air into the cylindrical housing through the first circular opening and to exhaust air out of the cylindrical housing through the plurality of apertures to cause airflow through the attic of the building structure;
a flashing connected to the cylindrical housing at the first circular opening and circumscribing the first circular opening, the flashing configured to connect to the roof of the building structure to secure the attic fan assembly to the roof; and
a cover connected to the cylindrical housing at the second circular opening, the cover positioned over the second circular opening to inhibit environmental debris from entering the cylindrical housing.

2. The attic fan assembly of claim 1, wherein the plurality of apertures are positioned in a honeycomb pattern.

3. The attic fan assembly of claim 1, wherein the plurality of apertures are offset relative to each other along the central axis.

4. The attic fan assembly of claim 1, wherein the plurality of apertures are aligned along a line extending at an angle offset from the central axis.

5. The attic fan assembly of claim 1, wherein the two or more apertures are circular.

6. The attic fan assembly of claim 1, wherein the plurality of apertures are on the sidewall less than half of an extent of the sidewall.

7. The attic fan assembly of claim 1, wherein five or more apertures of the plurality of apertures are along a circumference of the cylindrical housing, the five or more apertures including at least one aperture of the two or more apertures.

8. The attic fan assembly of claim 1, wherein the protrusion is a bead of the sidewall of the cylindrical housing, the bead formed from the monolithic material of the sidewall.

9. The attic fan assembly of claim 1, wherein the protrusion comprises a rod or a flange positioned about the cylindrical housing.

10. The attic fan assembly of claim 1, wherein the sidewall comprises tabs extending radially outward from the cylindrical housing at the second circular opening, the cover connected to the cylindrical housing via the tabs.

11. The attic fan assembly of claim 1, wherein the sidewall supports the cover without other support brackets.

12. The attic fan assembly of claim 1, wherein the monolithic material from the first circular opening to the second circular opening with the plurality of apertures has the same thickness from the first circular opening to the second circular opening.

13. The attic fan assembly of claim 1, wherein the plurality of apertures are on a first portion of the sidewall, wherein the plurality of apertures are less than 80% of the total area of the first portion of the sidewall with the plurality of apertures, wherein a second portion of the sidewall is without apertures for airflow, and wherein the monolithic material is the first and second portions of the sidewall.

14. The attic fan assembly of claim 1, further comprising supports connected to the monolithic material of the sidewall and the motor for the monolithic material of the sidewall to support the motor inside the cylindrical housing.

15. The attic fan assembly of claim 1, further comprising a rim at the second circular opening, the rim comprising the monolithic material of the sidewall without any of the plurality of apertures and extending fully around the second circular opening about the central axis such that the plurality of apertures are positioned away from a top portion of the cylindrical housing at the second circular opening.

16. An attic fan housing comprising:
a first opening;
a second opening;
a rigid sidewall extending between the first opening and the second opening, the rigid sidewall configured to support a motor for rotating a fan blade assembly; four or more apertures in the rigid sidewall, wherein the four or more apertures are positioned in a symmetrical pattern along an extent of the rigid sidewall, the extent between the first and second openings;
a rim at the second opening, the rim being the rigid sidewall without any of the four or more apertures and extending fully around the second opening such that the four or more apertures are positioned away from a top portion of the second opening; and
a connecting portion extending fully between the first opening and the second opening, the connecting portion being the rigid sidewall without any of the four or more apertures in the connecting portion.

17. The attic fan housing of claim 16, wherein the rigid sidewall has a cylindrical shape.

18. The attic fan housing of claim 16, further comprising a bead extending around the rigid sidewall, the bead configured to inhibit environmental debris from entering the housing.

19. The attic fan housing of claim 18, wherein the bead is a protrusion of the rigid sidewall of the housing.

20. The attic fan housing of claim 16, wherein the rigid sidewall is monolithic.

21. The attic fan housing of claim 16, wherein the rigid sidewall comprises a plurality of sections moveable relative to each other about a central axis of the housing, at least two of the plurality of sections comprising a long extent portion along the central axis relative to a short extent portion along the central axis to allow for adjustment of an angle between the first opening and the second opening based on relative positions of the long extent portion and the short extent portion of the at least two of the plurality of sections about the central axis.

22. The attic fan housing of claim 16, wherein the four or more apertures are positioned in a honeycomb pattern.

23. The attic fan housing of claim 16, wherein the four or more apertures are offset relative to each other along a central axis of the housing.

24. The attic fan housing of claim 16, wherein the four or more apertures are aligned along a central axis of the housing.

25. The attic fan housing of claim 16, wherein the four or more apertures are aligned along a line extending at an angle offset from a central axis of the housing.

26. The attic fan housing of claim 16, wherein the four or more apertures are circular.

27. The attic fan housing of claim 16, wherein the four or more apertures are on the rigid sidewall less than half of the extent of the rigid sidewall.

28. The attic fan housing of claim 16, further comprising a cover connected to the rigid sidewall at the second opening, wherein the rigid sidewall comprises tabs extending outward from the rigid sidewall at the second opening, the cover connected to the rigid sidewall via the tabs.

29. The attic fan housing of claim 17, further comprising five or more apertures along a circumference of the rigid sidewall, the four or more apertures including at least one aperture of the five or more apertures.

30. The attic fan housing of claim 16, wherein the four or more apertures are formed in a continuous piece of material forming the rigid sidewall from the first opening to the second opening.

31. The attic fan housing of claim 16, wherein the rigid sidewall extends fully between the first opening and the second opening.

32. An attic fan assembly for a roof to cause airflow through an attic of a building structure, the attic fan assembly comprising:

a housing comprising:
 a first opening;
 a second opening opposite the first opening;
 a sidewall extending between the first opening and the second opening, wherein the sidewall is a monolithic material;
 a plurality of apertures in the monolithic material of the sidewall, wherein two or more apertures of the plurality of apertures are aligned along a line extending at an angle offset from a central axis of the first opening or the second opening; and
 a rim at the second opening, the rim comprising the monolithic material of the sidewall without any of the plurality of apertures and extending around the second opening about the central axis such that the plurality of apertures are positioned away from a top portion of the housing at the second opening;
a motor configured to rotate a fan drive shaft, the motor disposed inside the housing, the monolithic material of the sidewall supporting the motor inside the housing; and
a fan blade assembly within the housing and secured to the fan drive shaft, wherein the motor and the fan blade assembly are configured to draw air into the housing through the first opening and to exhaust air out of the housing through the plurality of apertures to cause airflow through the attic of the building structure.

33. The attic fan assembly of claim 32, wherein the plurality of apertures are positioned in a honeycomb pattern.

34. The attic fan assembly of claim 32, wherein the plurality of apertures are offset relative to each other along the central axis.

35. The attic fan assembly of claim 32, wherein two or more apertures of the plurality of apertures are aligned along the central axis, the two or more apertures aligned along the central axis including at least one aperture of the two or more apertures aligned along the line.

36. The attic fan assembly of claim 32, wherein the housing further comprises a connecting portion extending between the first opening and the second opening along the central axis, the connecting portion comprising the monolithic material of the sidewall without any of the plurality of apertures in the connecting portion.

* * * * *